United States Patent
Goldstein et al.

(10) Patent No.: US 6,777,982 B2
(45) Date of Patent: Aug. 17, 2004

(54) MOLECULAR SCALE LATCH AND ASSOCIATED CLOCKING SCHEME TO PROVIDE GAIN, MEMORY AND I/O ISOLATION

(75) Inventors: Seth Copen Goldstein, Pittsburgh, PA (US); Daniel L. Rosewater, Philadelphia, PA (US)

(73) Assignee: Carnegie Mellon University, Pittsburgh, PA (US)

(*) Notice: Subject to any disclaimer, the term of this patent is extended or adjusted under 35 U.S.C. 154(b) by 50 days.

(21) Appl. No.: 10/116,501

(22) Filed: Apr. 3, 2002

(65) Prior Publication Data

US 2002/0175390 A1 Nov. 28, 2002

Related U.S. Application Data

(60) Provisional application No. 60/281,168, filed on Apr. 3, 2001.

(51) Int. Cl.[7] .................. H03K 19/20; H03K 19/173
(52) U.S. Cl. .................. 326/134; 326/46; 326/136; 327/568
(58) Field of Search ............... 326/38, 46, 47, 326/134–136; 327/190–200, 499–500, 568, 570

(56) References Cited

U.S. PATENT DOCUMENTS

| | | | | |
|---|---|---|---|---|
| 4,721,983 A | * | 1/1988 | Frazier | 257/24 |
| 5,267,193 A | * | 11/1993 | Lin | 365/168 |
| 5,444,751 A | * | 8/1995 | Sage | 377/78 |
| 5,589,692 A | | 12/1996 | Reed | |
| 5,815,008 A | * | 9/1998 | Williamson et al. | 326/134 |
| 6,128,214 A | | 10/2000 | Kuekes et al. | |
| 6,459,095 B1 | | 10/2002 | Heath et al. | |

FOREIGN PATENT DOCUMENTS

| | | | |
|---|---|---|---|
| DE | 100 13 013 A1 | 3/1999 | |
| JP | 11068521 A | * 3/1999 | .......... H03K/3/315 |
| WO | WO 96/30508 A1 | 10/1996 | |
| WO | WO 99/04440 A1 | 1/1999 | |
| WO | WO 99/60165 A1 | 11/1999 | |
| WO | WO 00/44094 A1 | 7/2000 | |

OTHER PUBLICATIONS

Altera, SignalTap Embedded Logic Analyzer Megafuction, Apr., 2001, Altera Corporation, pp. 1–8.*
Xilinx, Virtex 2.5V Field Programmable Gate Arrays, Apr. 2, 2001, Xilinx Product Specification, pp. 1–4.*
I. Aleksander et al., Tunnel Devices as Switching Elements, *Journal British IRE*, 23(43):177–192, Mar. 1962.
R. Chau et al., 30 NM Physical Gate Length CMOS Transistors with 1.0 PS N–MOS ad 1.7 PS P–MOS Gate Delays, *International Electron Devices Meeting*, Dec. 2000.
J. Chen et al., Room–Temperature Negative Differential Resistance in Nonoscale Molecular Junctions, *Applied Physics Letter*, 77(8):1224–6.2000.
J. Chen et al., Large On–Off Ratios and Negative Differential Resistance in a Molecular Electronic Device, *Science*, 286:1550–2, 1999.

(List continued on next page.)

*Primary Examiner*—James H. Cho
(74) *Attorney, Agent, or Firm*—Kirkpatrick & Lockhart LLP

(57) ABSTRACT

Chemically assembled electronic nanotechnology (CAEN) provides an alternative to using Complementary Metal Oxide Semiconductor (CMOS) for constructing circuits with feature sizes in the tens of nanometers. A molecular latch and a method using the latch that enables it to act as a state holding device, perform voltage restoration, and to provide I/O isolation is disclosed.

58 Claims, 24 Drawing Sheets

OTHER PUBLICATIONS

C. P. Collier et al., Electronically Configurable Molecular-Based Logic Gates, *Science*, 285:391-3, Jul. 1999.

W.B. Culbertson et al., The Teramac Custom Computer: Extending the Limits with Defect Tolerance, *Proc. IEEE International Symposium on Defect and Fault Tolerance in VLSI Systems*, 1996.

W.B. Culbertson et al., Defect Tolerance on the Teramac Custom Computer, *Proceedings of the 1997 IEEE Symposium of FPGAs for Custom Computing Machines*, pp. 116–124, Apr. 1997.

A. Nakajima et al., Room Temperature Operation of SI Single-Electron Memory with Self-Aligned Floating Dot Gate, *Appl. Phys. Lett*, 70:1742, 1997.

S. C. Goldstein et al., Nanofabrics: Spatial CoOmputing Using Molecular Electronics, *Proceedings of the 28th Annual International Symposium on Computer Architecture*, Jun. 2001.

R. W. Keyes, What Makes a Good Computer Device? *Science*, 230 (4722):138–44, Oct. 1985.

B. R. Martin et al., Orthogonal Self Assembly on Colloidal Gold-Platinum Nanorods, *Advanced Materials*, 11:1021-25, 1999.

R. H. Mathews, A New RTD-FET Logic Family, *Proceedings of the IEEE* 87(4):596, 1999.

J. K. N. Mbindyo, et al., DNA-Directed Assembly of Gold Nanowires on Complementary Surfaces, *Advanced Materials*, 2000.

N. Spencer et al., The Self-Assembly of a Switchable [2] Rotaxane, *Angewandte Chemie International Edition English*, 36:1904, 1997.

H. Park et al., Fabrication of Metallic Electrodes with Nanometer Separation by Electromigration, www.physics.berkeley.edu/research/mceuen/topcs/nanocrystal/EMPaper.pdf, 1999.

T. Ruecks et al., Carbon Nanotube-Based Nonvolatile Random Access Memory for Molecular Computing, *Science*, 289:94–97, 2000.

S. J. Tans et al., Individual Single-Wall Carbon Nanotubes as Quantum Wires, *Nature*, 386(6624):474–7, Apr. 1997.

R. Amerson et al., Teramac—Configurable Custom Computing, *Proceedings of IEEE Workshop on FPGAs for Custom Computing Machines*, pp. 32–38, Napa, CA, Apr., 1995.

A. Aviram et al., Molecular Rectifiers, *Chemical Physics Letters*, 29(2):277–283, Nov. 1974.

V. Betz et al., VPR: A New Packing, Placement and Routing Tool for FPGA Research, *Proceedings of the International Workshop on Field Programmable Logic and Applications*, Aug., 1997.

R. Chen, Single-Electron Transistor Logic, *Appl., Lett.*, 68: 1954, 1996.

Y. Cui et al., Functional Nonoscale Electronic Devices Assembled using Silicon Nanowire Building Blocks, *Science*, 291:851–583, 2001.

D. Culler et al., Parallel Programming in Split-C, *Proceedings for the Supercomputing '93 Conference*, Nov. 1993.

S. Hauck et al., Configuration Compression for the Xilinx XC6200 FPGA, *IEEE Trans. On CAD of IC and Systems*, vol. 18, 8, pp. 1107–1113, Aug. 1999.

R. W. Keyes Miniaturization of Electronics and Its Limits, *IBM Journal of Research and Development*, 32(1):24–48, Jan. 1988.

T. Mallouk, Nanomaterials: Synthesis and Assembly, http://research.chem.psu.edu/mallouk/–nano.pbf, Nov. 2000, For-eight Conference Tutorial.

M. A. Reed, Molecular-Scale Electronics, *Proceedings of the IEEE*, 87(4), Apr. 1999.

A. Srivastava et al., ATOM: A System for Building Customized Program Analysis Tools, *Technical Report, Digital Equipment Corporation Western Research Laboratory*, 1994.

A. Ye et al., Chimaera: A High-Performance Architecture with a Tightly-Coupled Reconfigurable Functional Unit, *Proceedings of the 27th Annual International Symposium on Computer Architecture*, Jun. 2000.

Vedeneev, A.S., "Molecular-Scale Rectifying Diodes Based on Y-Junction Carbon Nanotubes," XP-001004406, Department of Electrical and Computer Engineering, University of Toronto, Toronto, Ontario, Canada M5S3G4, 1999 IEEE, pp. 1–3, IEDM 99–231.

Collier, C.P., "Electronically Configurable Molecular-Based Logic Gates," XP-002149479, Science vol. 285, Jul. 16, 1999., pp. 391–394.

\* cited by examiner

High and Low States of Bistable Latch

US 6,777,982 B2

MOLECULAR SCALE LATCH AND ASSOCIATED CLOCKING SCHEME TO PROVIDE GAIN, MEMORY AND I/O ISOLATION

CROSS REFERENCE TO RELATED APPLICATION

This application claims the benefit of U.S. Provisional Application No. 60/281,168, filed Apr. 3, 2001.

STATEMENT REGARDING FEDERALLY SPONSORED RESEARCH AND DEVELOPMENT

This work was supported in part under DARPA #: N4000140110659. The United States government may have certain rights to this invention.

BACKGROUND

1. Technical Field

The device, system and method relates generally to electronic nanotechnology, and more specifically to Chemically Assembled Electronic Nanotechnology (CAEN) electronic devices and circuits.

2. Description of Related Art

In 1985, Keyes argued that the silicon transistor would not be easily replaced as the building block in digital circuits. See Robert W. Keyes, "What Makes A Good Computer Device?" Science, October, 1985, 230(4722), pp. 138–44. Although faster switching technologies have been introduced, none possess the wide array of desirable features to match silicon such as: current gain, voltage restoration, noise reduction, tolerance to variability in the manufacturing process, isolation of inputs from outputs, excellent fan-in and fan-out, the ability to invert a signal, tolerance to the high demands of a system environment, and a huge body of research and financial commitment to their use and manufacture. Since that time, advancements in Complementary Metal Oxide Semiconductor (CMOS) technology have increased speed and decreased the size of transistors at a phenomenal rate; recent work has produced 30-nm CMOS gates that switch in less than 2 ps. See R. Chau et al., "30 nm Physical Gate Length CMOS Transistors With 1.0 ps N-MOS and 1.7 ps P-MOS Gate Delays," International Electron Devices Meeting, December, 2000.

Impressive as these results have been, in the near future further increases in the performance of silicon-based, lithographically manufactured transistors will be difficult to achieve. First, the small line widths necessary for next-generation lithography require the use of increasingly shorter wavelength light, which introduces a host of problems that are currently being addressed. In addition, as the number of atoms constituting a device decreases, manufacturing variability of even a few atom widths can become significant and lead to defects.

More important, however, is the economic barrier to commercial nanometerscale lithography. New fabrication facilities costing orders of magnitude more than present ones will be required to produce chips with the required densities while maintaining acceptably low defect rates. The increasing cost of chip masks, which generally must be manufactured to single-atom tolerances, precludes commercially viable development of new chips except for the highest-volume integrated circuits (ICs). It is entirely possible that further reduction of transistor size will be halted by economic, rather than technological factors.

This economic downside is a direct consequence of lithographic fabrication because construction of devices and their assembly into circuits occurs at the same time. Keyes pointed out that the great advantage of silicon is that mass fabrication of transistors is extremely inexpensive on a per transistor basis. As Keyes also highlighted, however, this produces a set of constraints in that each element in the system must be highly reliable and devices cannot be tested, adjusted, or repaired after manufacture. These constraints force the design of the circuit to be tightly integrated with manufacture, because no additional complexity can be introduced into the circuit after its manufacture. Lithography is perfectly tuned to deal with these constraints, but at small scales the constraints become the obstacle to further improvements. To be widely accepted, any technology hoping to displace lithographically produced CMOS integrated circuits must overcome these obstacles, while sacrificing neither performance nor the low per-unit cost made possible by mass production.

Chemically assembled electronic nanotechnology (CAEN) holds promise as a technology to overcome these obstacles. It takes advantage of chemical synthesis techniques to construct circuit elements. Synthesis can occur in bulk, producing enormous quantities (moles) of identical devices, or devices can be grown in situ. Many different molecular scale devices have already been synthesized, including negative differential resistors (NDR) (See J. Chen, M. A. Reed, A. M. Rawlett and J. M. Tour, "Observation Of A Large On-Off Ratio And Negative Differential Resistance In An Electronic Molecular Switch," Science, 1999, 286, pp. 1550–52; J. Chen and M. A. Reed, "Molecular Wires, Switches And Memories," Molecular Electronics 2000, December, 2000), resistors, transistors, diodes, and reconfigurable switches (See J. Chen et al., "Room-Temperature Negative Differential Resistance In Nanoscale Molecular Junctions," Applied Physics Letters, 2000, 77(8), pp. 1224–26; C. P Collier, E. W. Wong, M. Belohradsky, F. M. Raymo, J. F. Stoddart, P. J. Kuekes, R. S. Williams and J. R. Heath, "Electronically Configurable Molecular-Based Logic Gates," Science, July, 1999, 285, pp. 391–93). In all cases, the fabricated devices are on the order of a few nanometers and exploit the quantum mechanical properties of their constituents for proper operation.

While no direct comparison between CAEN and CMOS devices is possible, CAEN devices are relatively very small. A single CAEN switch-diode pair (as used in the circuits described hereinafter) will generally require an area of about 800 $n^2$ as opposed to 100,000 $nm^2$ for a single laid-out CMOS transistor. For example, a CAEN device can be implemented with nanowires on 20 m centers. In contrast, a CMOS transistor with a 4:1 ratio in a 70 nm process, (even using Silicon on Insulator, which does not require wells) with no wires attached measures 210 nm×280 nm. Attaching minimally sized wires to the terminals increases the size of the CMOS device to 350 nm×350 nm. A simple CMOS logic gate or static memory cell requires several transistors, separate p- and n-wells and wiring interconnects, resulting in a factor of more than one hundred difference in density between CAEN and CMOS. Furthermore, CAEN devices use a lot less power relative to CMOS devices because very few electrons are required for switching.

Alone, however, molecular-scale devices cannot overcome the limiting constraints of CMOS technology unless a suitable manufacturing technique can be devised for forming molecular-scale devices into circuits. Their small size and the fact that many are created separately from the circuit assembly process, means that it would be difficult to individually connect the nanoscale components. Economic viability requires that they be created and connected through self-assembly and self-alignment techniques. Several groups have recently demonstrated CAEN devices that are either self-assembled or self-aligned, or both. See C. P Collier, E. W. Wong, M. Belohradsky, F. M. Raymo, J. F. Stoddart, P. J. Kuekes, R. S. Williams and J. R. Heath, "Electronically Configurable Molecular-Based Logic Gates," Science, July, 1999, 285, pp. 391–93; N. Spencer M. V. Martinez-Diaz and J. F. Stoddart, "The Self-Assembly Of A Switchable Rotaxane," Angewandte Chemie International Edition English, 1997, 36, p. 1904; A. Nakajima et al., "Room Temperature Operation Of Si Single-Electron Memory With Self-Aligned Floating Dot Gate, Appl. Phys. Lett, 1997, 70, pp. 1742, 1997; and T. Rueckes, K. Kim., E. Joselevich., G. J. Tseng, C. -L. Cheung and C. M. Lieber, "Carbon Nanotube-Based Nonvolatile Random Access Memory For Molecular Computing," Science, 2000, 289, pp. 94–97. Advances also have been made in creating wires out of single-wall carbon nanotubes and aligning them on a silicon substrate. See S. J. Tans et al, "Individual Single-Wall Carbon Nanotubes As Quantum Wires," Nature, April, 1997, 386(6624), pp. 474–77; H. Park, A. K. L. Lim, J. Park, A. P. Alivisatos and P. L. McEuen, "Fabrication Of Metallic Electrodes With Nanometer Separation By Electromigration," www.physics.berkeley.edu/research/mceuen/topics/nanocrystal/EMPaper.pdf, 1999. Even more practically, metal nanowires, which scale down to 5 nm and include embedded devices, have been fabricated. See B. R. Martin, D. J. Dermody, B. D. Reiss, M. Fang, L. A. Lyon, M. J. Natan, and T. E. Mallouk, "Orthogonal Self Assembly On Colloidal Gold-Platinum Nanorods," 1999, Advanced Materials, 11, pp. 1021–25; J. K. N. Mbindyo, B. D. Reiss, B. R. Martin, B. D. Reiss, M. J. Keating, M. J. Natan, and T. E. Mallouk, "DNA-Directed Assembly Of Gold Nanowires On Complementary Surfaces," Advanced Materials, 2000.

Self-assembly of devices to form circuits imposes an entirely different set of constraints than lithography. Almost by definition, self-assembly will be an imprecise, thermodynamically controlled process. Therefore, one can no longer rely on the presence of highly reliable devices. Logically, this implies that the devices must be testable, adjustable, and/or repairable after manufacture to produce a working circuit, which also implies that some defects must be tolerated. Additionally, self-assembly can only produce a limited range of circuit complexity while remaining manageable. This requires a decoupling of the manufacturing process and the underlying architecture produced. Any deterministic aperiodic circuit will have to be created after the device is fabricated through a process known as reconfiguration.

SUMMARY

One embodiment of the present invention provides a latch, including: a first resonant tunneling diode having a first end and a second end, the first end forming an input node; and a second resonant tunneling diode having a first end and a second end, wherein the second end of the first resonant tunneling diode is connected to the first end of the second resonant tunneling diode forming a data node at a connection point therebetween; wherein an input voltage can be applied to the data node for latching a logic state at the data node.

Another embodiment of the present invention provides a circuit, including: a first combinational circuit; a first latch connected to the first combinational circuit, wherein the first latch is driven by a first clock signal and the first combinational circuit is powered by a first voltage; a second combinational circuit connected to the first latch; and a second latch connected to the second combinational circuit, wherein the second latch is driven by a second clock signal and the second combinational circuit is powered by a second voltage; and a power supply clocking scheme to provide Input/Output isolation, wherein the first clock and the first voltage are applied to the first latch and the first combinational circuit and the second clock and the second voltage are applied to the second latch and the second combinational circuit to provide Input/Output isolation between first latch and the first and second combinational circuits and the second latch; and wherein each of the first and second latches further include: a first resonant tunneling diode having a first end and a second end, the first end forming an input node; a second resonant tunneling diode having a first end and a second end, wherein the second end of the first resonant tunneling diode is connected to the first end of the second resonant tunneling diode forming a data node at a connection point therebetween; and an isolation circuit connected to the data node.

Yet another embodiment of the present invention provides a circuit, including: a combinational logic circuit having an input and an output and power supply input; and a latch having an input and an output and a clock input, the latch input is connected to the output of the combinational logic circuit; wherein the latch is driven by a power supply clocking scheme for providing Input/Output isolation; and wherein when a clock signal is applied to the latch the combinational logic circuit power supply input is modified to enable the operation of the latch and provide the Input/Output isolation between the combinational logic circuit and the latch; and wherein the latch further includes: a first resonant tunneling diode having a first end and a second end, the first end forming an input node; a second resonant tunneling diode having a first end and a second end, wherein the second end of the first resonant tunneling diode is connected to the first end of the second resonant tunneling diode forming a data node at a connection point therebetween; and an isolation circuit connected to the data node of the latch.

A further embodiment of the present invention provides a circuit, including: a chemically assembled electronic nanoblock having an input and an output; wherein the nanoblock can be programmed to implement a logic function.

Yet another embodiment of the present invention provides a method for constructing a molecular integrated circuit using chemically assembled electronic nanotechnology, including: forming an array of electrical wires on a substrate via a chemical self-assembly process; aligning the array of electrical wires; combining the array of electrical wires and forming a two dimensional grid-like structure; and creating an active electronic device at an intersection point of two wires on the grid-like structure.

Still another embodiment of the present invention provides a method of fabricating a chemically assembled electronic nanotechnology molecular latch, including: forming a first resonant tunneling diode having a first and second end on a chemically assembled electronic nanotechnology grid-like structure forming a nanoblock; connecting a second resonant tunneling diode having a first and second end to the first resonant tunneling diode and forming a data node therebetween, wherein the second end of the first resonant tunneling diode is connected to the first end of the second resonant tunneling diode; and connecting an isolation circuit to the data node.

Still a further embodiment of the present invention provides a method of fabricating a chemically assembled electronic nanotechnology circuit, including: forming a chemically assembled electronic nanotechnology molecular nano-fabric; forming a plurality of clusters on the nano-fabric; forming a plurality of long lines and adjacently disposing the long lines to each of the clusters for communicating signals between the clusters; and forming a nanoblock in at least one of the clusters and connecting an in-line latch to the nanoblock.

These and various other features of the embodiments of the present invention will become apparent to those skilled in the art from the following description and corresponding drawings. As will be realized, the present invention is capable of modification without departing from the scope of the invention. Accordingly, the description and the drawings are to be regarded as being illustrative in nature, and not as being restrictive.

BRIEF DESCRIPTION OF THE DRAWINGS

The present invention will be described in conjunction with the following figures, wherein like parts are referenced by like numerals throughout the several views and wherein.

DETAILED DESCRIPTION

Figure 1:
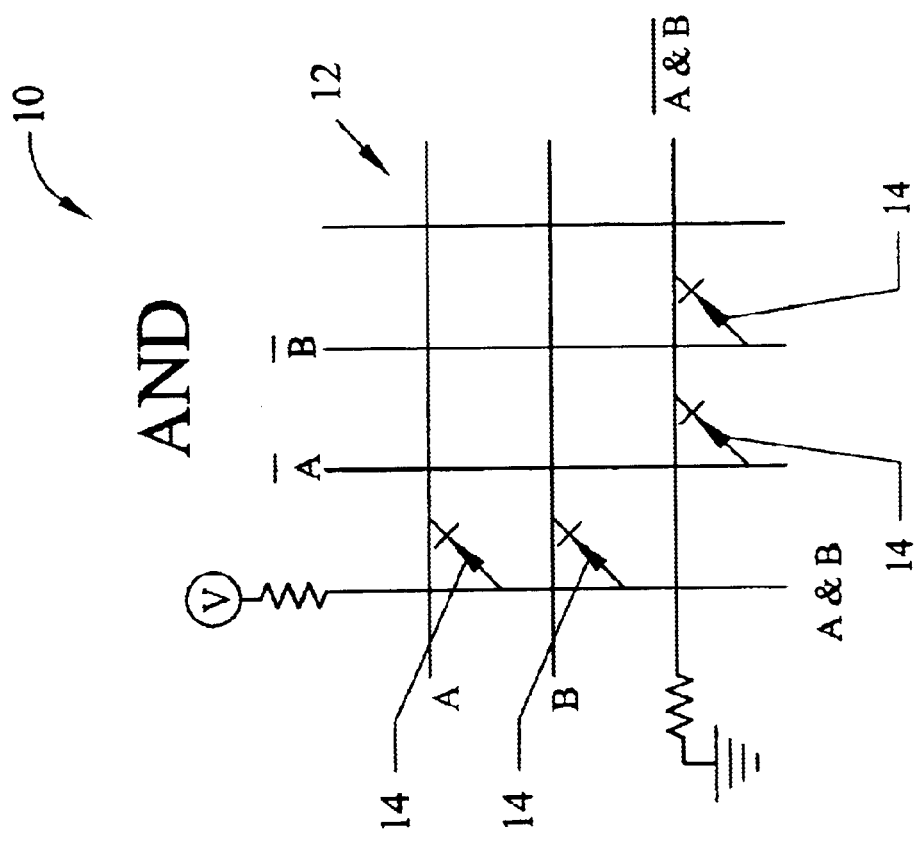
FIG. 1 illustrates one embodiment of a two-input AND gate implemented in a reconfigurable CAEN grid.

It is to be understood that the figures and descriptions of the present invention have been simplified to illustrate elements that are relevant for a clear understanding of the present invention, while eliminating, for purposes of clarity, other elements relating to a molecular nanotechnology circuit that are well known to those skilled in the art.

The present invention makes references to "Digital Logic Using Molecular Electronics," ISSCC'02}, February 2002, Seth Copen Goldstein with Daniel L. Rosewater and "Nano-Fabrics: Spatial Computing Using Molecular Electronics," ISCA'01, July 2001, Seth Copen Goldstein with Mihai Budiu, both of which are incorporated herein be reference.

Fabrication and Architecture

Having enumerated the constraints produced by Chemically Assembled Electronic Nanotechnology (CAEN), one embodiment of the present invention provides a fabrication process for constructing molecular integrated circuits using CAEN technology. In one embodiment, the process involves a hybrid of molecular self-assembly and lithographically produced aperiodic structures. Those skilled in the art will appreciate that this fabrication process is inexpensive notwithstanding the fact that it creates structures out of nano-scale components. Thus, at the nano-scale, all the processes are self-directed. Deterministic operations are allowed only at the micron-scale. The fabrication process is hierarchical, proceeding from basic components (e.g., wires and switches), through self-assembled arrays of components, to complete systems. Those skilled in the art will appreciate that chemical self-assembly is a process by which the components (e.g., wires or devices) are synthesized and connected together through chemical processes. See Tom Mallouk, "Nanomaterials: Synthesis and Assembly," http:// \-research.chem.psu.edu/\-mallouk/\-nano.pdf, November 2000, for an overview.

One embodiment of a fabrication process in accordance with the present invention provides a two-step assembly method. In one step, wires of different types are constructed through chemical self-assembly in bulk. Some of these wires may be functionalized, either by coating their exterior or by including inline devices along the axis of the wire. In a second step, groups of wires are aligned into rafts of parallel wires using well known flow techniques, for example. Note that if there are different types of wires in the raft, then there is no way to deterministically order them at the nano-scale. In one embodiment, two rafts can be combined to form a two-dimensional grid using the same flow techniques. The active devices are created at the intersection point of two appropriately functionalized wires. By appropriately choosing the molecules that coat the wires, the intersection points can be ohmic contacts, diodes, configurable switches, or other devices. Nevertheless, no precise alignment is required to create these devices and they occur wherever the rafts of wires intersect.

The resulting grids may be on the order of about a few microns. A separate process can be used to create a silicon-based die using standard lithography. The circuits on the silicon-based die can generally provide power, clock lines, an I/O interface, and support logic for the grids of switches created in the CAEN fabrication process according to one embodiment of the present invention. The silicon die may include "holes" in which the CAEN grids are placed, aligned, and connected with the wires on the die. Alternatively, the CAEN grids may be grown directly in the holes. Those skilled in the art will appreciate that it may be difficult to build inverters entirely from CAEN devices. Accordingly, CMOS inverters may be required at the input to the CAEN-based logic gates. The CAEN-based logic functions will generally compute both the desired output and its complement.

There are one or more fabrication methods that can be employed to construct the molecular latches. Two methods of fabricating such devices include: (1) In-line wire fabrication; and (2) Cross-point fabrication. The in-line wire fabrication method uses a technique to create wires with negative differential resistors (NDRs) at the ends of the wire. As an example, a first wire "L" is laid out in parallel to an input signal wire, referred to herein as wire "I" and an output wire, referred to herein as wire "O." A bridging wire, referred to herein as wire "B," crosses the three wires "L," "I," and "O." A diode will then be inserted between wire "I" and wire "B." Wire "B" will have a resistor placed between wires "L" and "O." Wire "O" will then be connected to ground and will have a resistor connected between ground and where it crosses wire "B."

The cross-point wire fabrication method uses only cross-points to create a latch. Thus, more wires are needed as compared to the in-line wire fabrication method described hereinbefore. Both techniques, however, depend on a molecular scale NDR molecule similar to a nitroamine based reed-tour molecule. Furthermore, the latch also can be formed using a lithographic scale using 3–5 semiconductors, or a combination of lithography and molecular scale devices.

Architectural Implications

The processes described hereinbefore require the manipulation of the nanoscale structures through directed self-assembly and self-alignment. Thus, the regular grid-like structures described above are manufactured using directed self-assembly and self-alignment techniques. While these grids are micron-scale sized and can be deterministically placed on a CMOS substrate, the nano-scale wires in the grids cannot be separately and deterministically connected to the pads on the CMOS substrate. Furthermore, the requirement of precise alignment for CMOS technology may rule out the end-to-end connections between nanoscale wires.

Accordingly, in order to create useful aperiodic circuits using CAEN, in one embodiment of the present invention, the fabricated grids are generally reconfigurable so that they can be programmed or configured after fabrication. To achieve this, one embodiment of the present invention provides as the main active component, a reconfigurable molecular diode (or a switch in series with a diode) at the intersections of the grid. The reconfigurable diode can either be configured "ON," in which case it acts like a diode, or it can be configured "OFF," in which case it acts like an open circuit.

FIG. 1 illustrates one embodiment of a two-input AND gate 10 implemented in a reconfigurable CAEN grid. The AND gate 10 is fabricated on a 3×3 grid 12 configured to implement the AND gate 10 logic function using reconfigurable diodes 14. Four of the nine reconfigurable diodes 14 are configured "ON." The remaining diodes are configured "OFF" and are not shown.

Those skilled in the art will appreciate that the non-deterministic nature of self-assembly will give rise to a certain level of defect densities. Instead of trying to eliminate these defects using conventional manufacturing techniques, one embodiment of the present invention provides one or more post-fabrication steps that can be performed to allow the CAEN-based chip to work in spite of its defects. A method first used in the Teramac custom computer to handle defects is to exploit the reconfigurable nature of the device. See W. B. Culbertson, R. Amerson, R. Carter, P. Kuekes, and G. Snider, "Defect Tolerance On The Teramac Custom Computer," Proceedings of the 1997 IEEE Symposium on FPGAs for Custom Computing Machines, April, 1997, pp. 116–24. First, the device is configured for self-diagnosis. The result of the self-diagnosis phase is the production of a defect map. Then, when the device is to be configured to perform its desired function, the defect map is used to configure the desired functionality around the defects. Reconfigurability is thus integral to the operation of a CAEN-based device in order to accommodate the defects likely to be introduced during the manufacturing process.

Because CAEN-based circuits may be used for performing logic and restoration operations, the hybrid approach described hereinbefore overcomes one of the main limitations of diode-resistor logic, the lack of signal inversion functionality. Accordingly, signals and their complements can be generated as inputs to each CAEN-based block by the addition of CMOS support circuitry. This idea can be extended to the use of CMOS transistors for gain and voltage restoration at the edges of each CAEN logic block, in addition to inversion. The addition of the CMOS transistors, which are significantly larger than their CAEN-based counterparts, may result in an overall decrease in the density of the nano-fabric. See S. C. Goldstein and M. Budiu, "Nano-fabrics: Spatial Computing Using Molecular Electronics," Proceedings of the 28th Annual International Symposium on Computer Architecture, June 2001.

One embodiment of the present invention provides the addition of a molecular latch as an alternative to providing CMOS support circuitry. The molecular latch is constructed entirely from molecular-scale devices that can perform signal restoration using power from the clock to provide gain. The idea is analogous to early work conducted on tunnel diodes, see I. Aleksander and R. W. A. Scarr, 1962, British IRE, 23(43), p. 177, and more recently on compound semiconductor resonant tunneling diodes. See R. H. Mathews, J. P. Sage, T. Sollner, S. D. Calawa, C. Chen, L. J. Mahoney, P. A. Maki, and K. M. Molvar, "A New rtd-fet Logic Family," 1999, Proceedings of the IEEE, 87(4), p. 596. Further, one embodiment of the present invention provides a molecular latch that includes additional properties to signal inversion such as voltage and current restoration. Simulation results indicate that the molecular latch is relatively tolerant to manufacturing variability and with appropriate circuit modifications can confer adequate I/O isolation and fan-out.

Molecular Latch Operation

Figure 2:
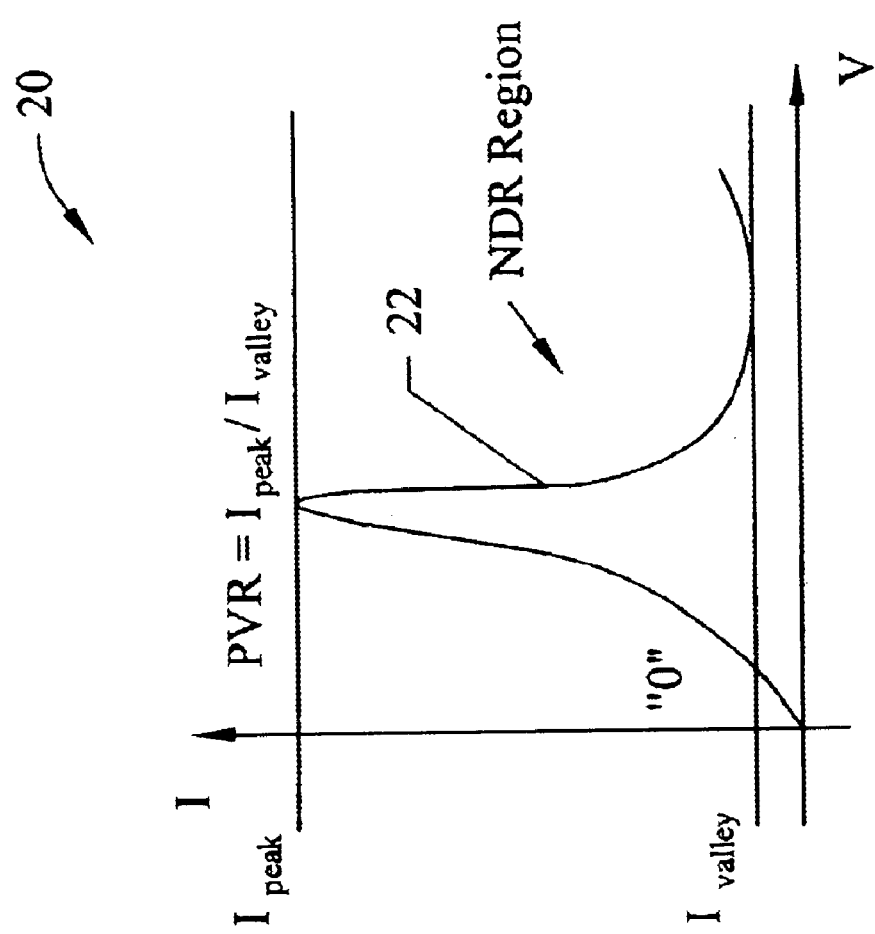
FIG. 2 illustrates one embodiment of an I-V curve of one embodiment of an RTD device.

In one embodiment of the present invention, the molecular latch is constructed from a pair of molecular resonant tunneling diodes (RTDs). FIG. 2 illustrates one embodiment of an I-V characteristic curve 20 of a representative RTD. One feature of the RTD I-V characteristic curve 20 is a region 22 of negative differential resistance (NDR), where the tunneling current falls as the voltage is increased. The ratio of the current at the beginning of the NDR region 22 ($I_{peak}$) to the current at the end of the region 22 ($I_{valley}$) is called the peak-to-valley ratio (PVR). Molecular RTDs that operate at room temperature with PVRs of 10 have already been realized. See J. Chen, M. A. Reed, A. M. Rawlett, and J. M. Tour, "Observation Of A Large On-Off Ratio And Negative Differential Resistance In An Electronic Molecular Switch," Science, 1999, 286, pp. 1550–52; "Proceedings of International Conference on Molecular Electronics," December, 2000, Kona, Hi.

Figure 3B:
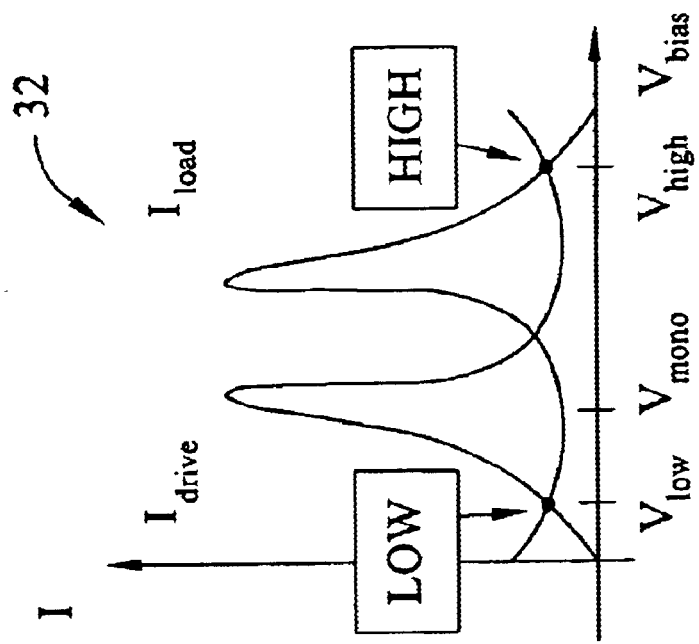
FIG. 3B illustrates one embodiment of a load-line diagram of a molecular latch.
Figure 3A:
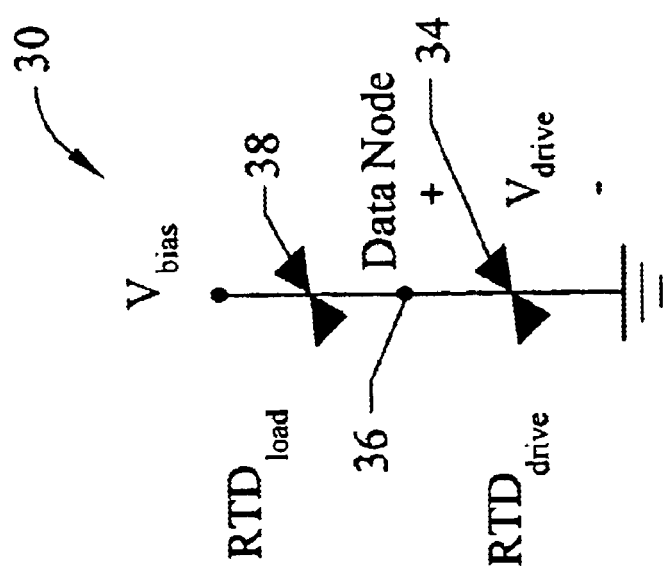
FIG. 3A illustrates one embodiment of a molecular latch configuration.

FIG. 3A illustrates one embodiment of a molecular bistable latch 30 configuration. The molecular latch 30 comprises a load RTD 38 and a drive RTD 34 connected at a voltage node 36 (e.g., a data node). The molecular latch 30 is shown being driven by $V_{bias}$ at the input node. The voltage at the data node 36 formed between the RTDs 34, 38 determines the state of the latch 30.

FIG. 3B illustrates one embodiment of a load-line diagram 32 corresponding to the molecular latch 30. The arrangement of the drive RTD 34 and the load RTD 38 in the molecular latch 30 and the corresponding load-line diagram 32 are shown at a voltage of $V_{bias}$. The load-line diagram 32 shows the High and Low logic states of the bistable latch 30 using the NDR regions. The load-line diagram 32 shows two distinct stable states, $V_{low}$ and $V_{high}$, and a third metastable state. Small voltage fluctuations in the metastable state will push the circuit into one or the other of the stable states. In one embodiment of the present invention, the Low state represents a binary logic "0," while the High state represents a binary logic "1."

Temporarily disrupting and restoring the bistable equilibrium state changes the state of the latch 30. Accordingly, when the equilibrium of the latch 30 is disrupted, the bias voltage ($V_{bias}$) temporarily drops to $V_{mono}$ and causes a shift of the load-line to the left such that the circuit has only one stable state. The bias voltage is then returned to $V_{bias}$. During the evolution from the monostable to the bistable state (the monostable-bistable transition, or MBT), current introduced in the data node 36 flows through the drive RTD 34. If the power introduced by this current exceeds a threshold value, the circuit 30 evolves to the high state. Conversely, the absence of external current during the transition results in the circuit 30 entering the low state. The amount of power necessary to force the latch 30 into the high state is determined by the PVR of the particular RTD. For a well-matched RTD pair, this current can be relatively small. See I. Aleksander and R. W. A. Scarr, 1962, British IRE, 23(43), p. 177.

Those skilled in the art will appreciate that a higher PVR may necessitate the addition of more current to set the latch 30 into the high state. A higher PVR, however, may provide more stability against current variation. In one embodiment of the present invention, the drive RTD 34 may be more resistive than the load RTD 38.

Mathews et al. have already exploited RTD latch technology in constructing a GaAs FET logic family. See R. H. Mathews, J. P. Sage, T. Sollner, S. D. Calawa, C. Chen, L. J. Mahoney, P. A. Maki, and K. M. Molvar, "A New rtd-fet Logic Family," 1999, Proceedings of the IEEE, 87(4), p.596. Therein is described a series of logic gates constructed from RTD latches, FETs, and saturated resistors that display high switching speeds and low power dissipation. In CAEN-based circuits, the RTD latches 30 are used for providing voltage buffering by storing the state of a previous computation for use in a subsequent computation and for providing signal restoration to either the logic "0" or the logic "1" voltage states of each latch 30. The computations are performed by diode-resistor threshold logic and the latch 30 is used to restore the signal for a later computational stage. Work in the 1960s with tunnel diodes and threshold logic was hampered by high interdevice manufacturing variability (and lack of I/O isolation). The molecular RTDs discovered thus far have much higher PVRs than semiconductor-based devices, which may alleviate some of the problems discussed hereinafter.

Molecular Latch Simulations: Restoration and Reliability

Figure 4A:
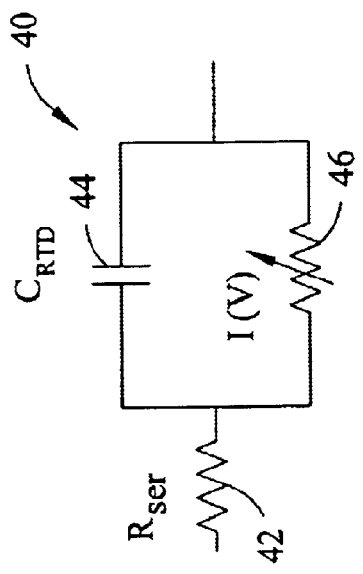
FIG. 4A illustrates one embodiment of a device model for an RTD device.
Figure 4B:
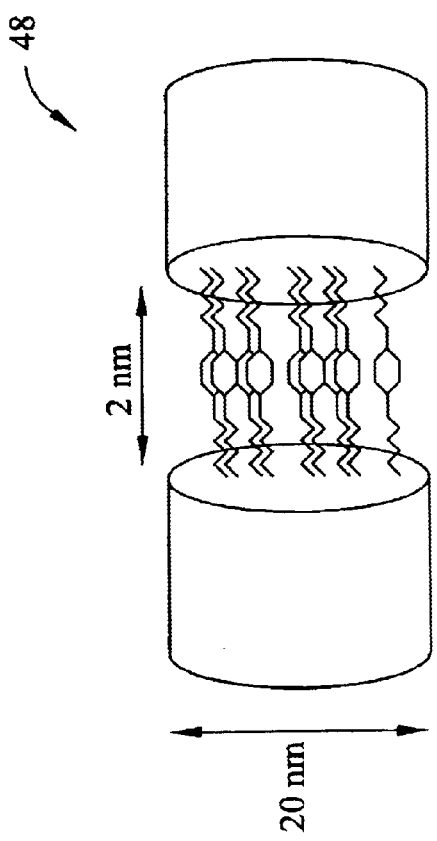
FIG. 4B illustrates one embodiment of a possible construction technique for a molecular RTD device.

Simulations of the behavior of one embodiment of molecular-scale RTD latches 30 can be conducted using, for example, Simulation Program with Integrated Circuit Emphasis (SPICE) (Eldo, Mentor Graphics). Device models similar to the device model described in Mathews et al. can be used to simulate each RTD device such as, for example, the drive RTD 34 and the load RTD 38 forming the molecular latch 30. FIG. 4A depicts an RTD model 40 for modeling RTD devices. The RTD model 40 includes a resistance 42 in series with a parallel combination of a capacitance 44 and a voltage-dependent current source 46. The RTD model 40 provides a good mesh with one embodiment of a proposed construction of molecular-scale RTDs, which can be accomplished by connecting two segments of a molecular-scale metal wire with a number of identical RTD molecules. Based on the estimated length and dielectric of the molecules and diameter of the molecular wires, it is estimated that each RTD will have a capacitance of about 2.7 $\mu$F. Reed and Tour have constructed model equations for the voltage-dependent current source to mimic the I-V curves reported at 190 K. See J. Chen, W. Wang, M. A. Reed, A. M. Rawlett, D. W. Price, and J. M. Tour, "Room-Temperature Negative Differential Resistance In Nanoscale Molecular Junctions," Appl. Phys. Let., August, 2000, 77(8), pp. 1224–26. To explore the RTD parameter space, models for several different "ideal" molecular RTDs can be constructed in which the $V_{peak}$ and $V_{valley}$ locations and resulting PVR can be varied. FIG. 4B illustrates generally at 48 one embodiment of a construction technique for the RTD model 40.

Figure 5B:
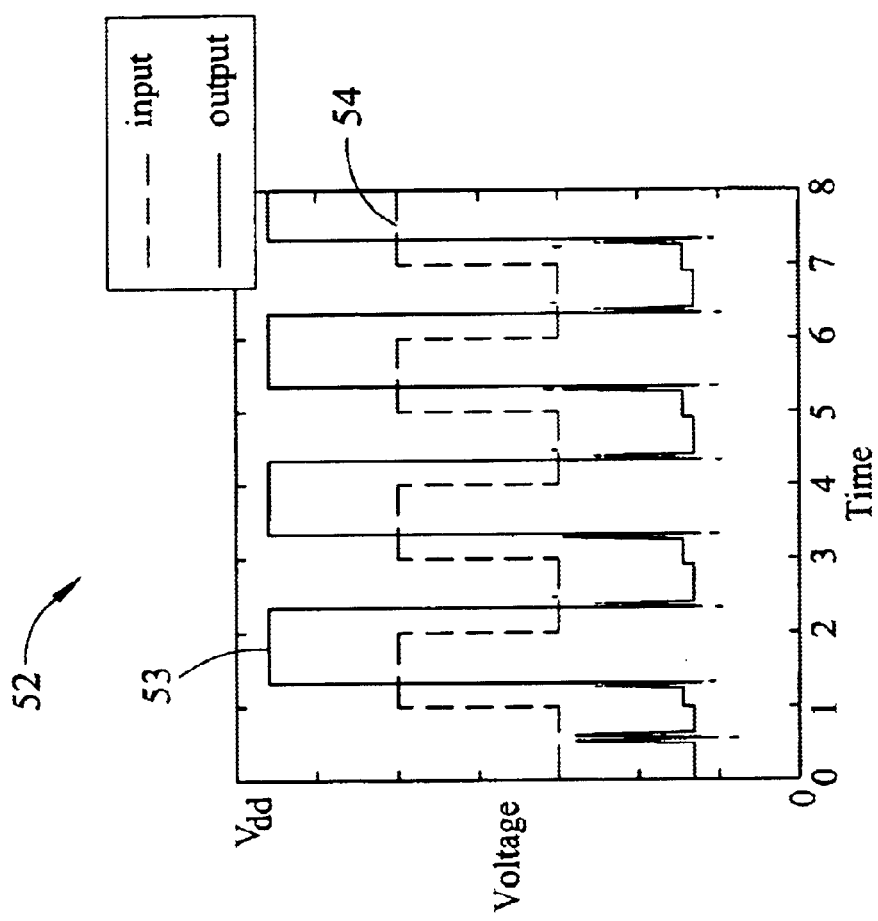
FIG. 5B illustrates one embodiment of a timing diagram of the latch circuit illustrated in FIG. 5A.
Figure 5A:
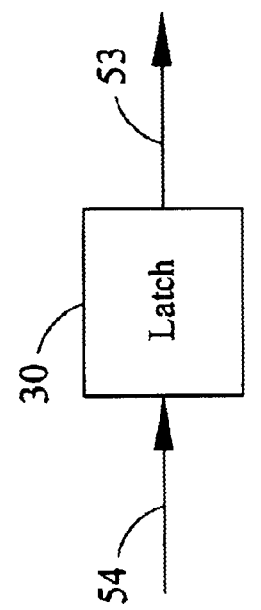
FIG. 5A illustrates one embodiment of a block diagram of a molecular latch circuit.

FIG. 5A illustrates a block diagram of the molecular latch 30 showing an input portion being driven by signal 54 and an output portion with a resulting signal 53. FIG. 5B illustrates a timing diagram 52 resulting from one embodiment of an RTD simulation using the Reed/Tour molecule as the basis of the RTD latch circuit 30. The relationship between the input signal 54 to the latch 30 and the corresponding output signal 53 is illustrated in the timing diagram 52. The clock signal is indicated as the input signal 54 to the latch 30 and is shaped to provide a MBT every cycle and to maintain the bistable state for the remainder of the cycle. The output signal has a voltage gain and provides a memory effect. Because the modeling of this circuit does not accurately reflect the RC constant produced by wire parasitics and other RC sources in a real circuit, the cycle time was deliberately chosen to be longer than required to ensure equilibrium before the next cycle. FIG. 5B shows that the voltage is restored to the levels predicted by the RTD load line 32 and the choice of $V_{bias}$. However, the relatively high-voltage NDR of the Reed/Tour molecule produces narrowly spaced logic "0" and logic "1" voltages for any reasonable choice Of $V_{bias}$. In one embodiment, the molecular RTD latch 30 can be formed with molecular RTDs having smaller $V_{peak}$ voltages so that a larger separation of low and high logic signals can be produced at a certain $V_{bias}$.

To determine the envelope of stability for the RTD, the behavior of the latch circuit 30 can be simulated by varying: the logic "low" and "high" input voltages, the input current, and the relative sizes of the load RTD 38 and the drive RTD 34. Simulation results indicate that simple RTD latches 30 in isolation are stable over a range of variability likely to be encountered in their synthesis. Although this characteristic has proved to be a significant stumbling block to the application of semiconductor RTDs, as device variability often falls outside the required range for incorporation into circuits, molecular RTDs have an advantage over semiconductor RTDs because every molecule incorporated into the molecular RTD is identical. Additionally, molecular RTDs have superior PVRs as compared to conventional RTDs, which improves the stability of the latches 30 constructed with them. See Mathews et al.

Combinations of Latches: I/O Isolation

Figure 6A:
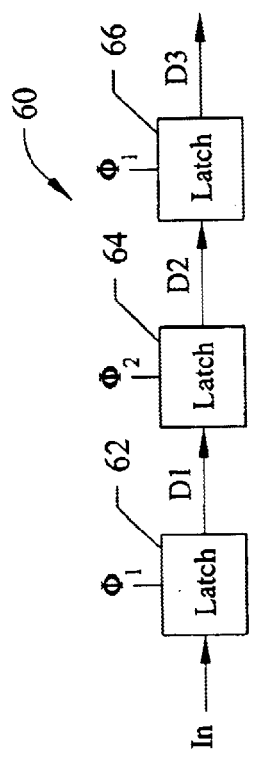
FIG. 6A illustrates one embodiment of a three-stage delay circuit using one embodiment of a molecular latch.
Figure 6B:
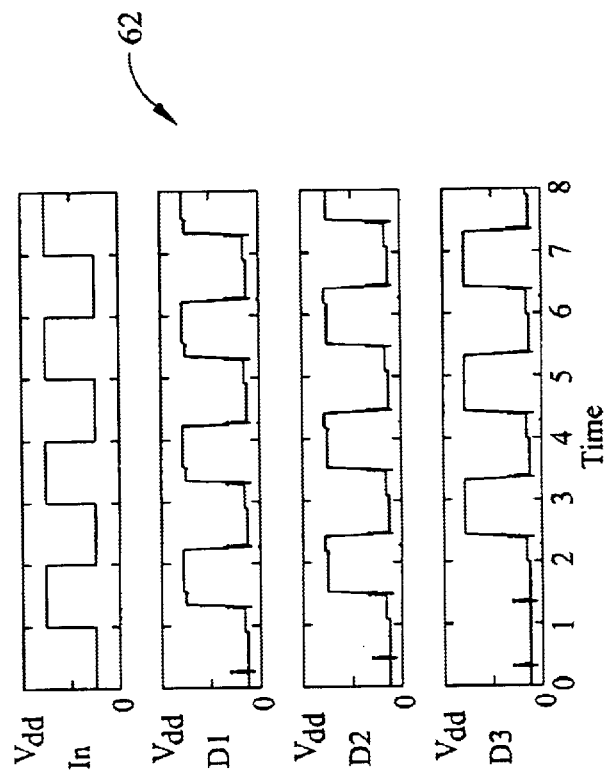
FIG. 6B illustrates one embodiment of a timing diagram of the delay circuit illustrated in FIG. 6A.

One embodiment of the present invention provides a molecular circuit formed as a combination of molecular latches 30. The molecular latches 30 can be used, for example, to buffer and condition the output of a diode-resistor combinational circuit to serve as inputs to a subsequent stage. Those skilled in the art will appreciate that buffering and conditioning is necessary because of the interactions associated with multiple latches 30. FIG. 6A illustrates one embodiment of a delay circuit 60 using a combination of multiple latches 62, 64, 66. Each of the multiple latches 62, 64, 66 comprises the general molecular latch 30 described hereinbefore with reference to FIG. 3A. The multiple latches 62, 64, 66 forming the delay circuit 60 are connected in series and are driven with alternating clock phases, $\Phi_1$ and $\Phi_2$. FIG. 6B illustrates one embodiment of several timing diagrams 62 associated with the operation and signal propagation in the delay circuit 60.

Figure 7C:
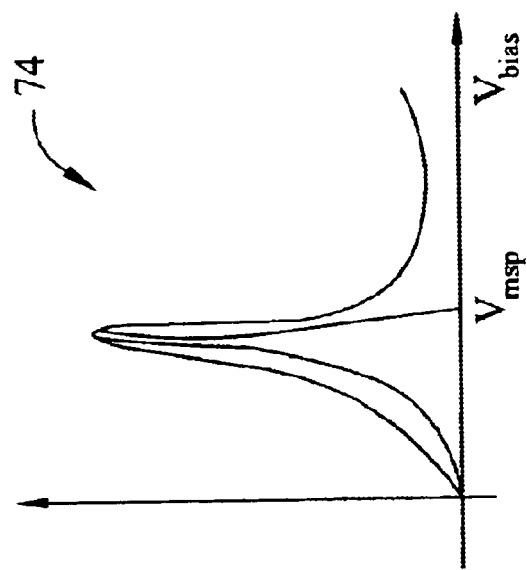
FIG. 7C illustrates one embodiment of a load-line diagram of a molecular latch.
Figure 7A:
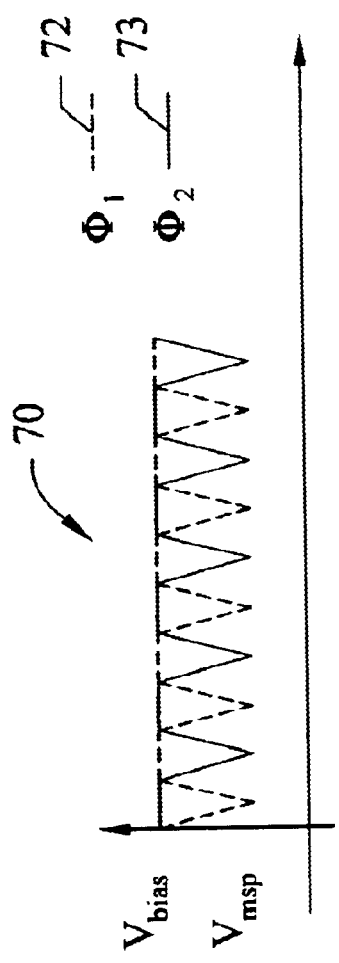
FIG. 7A illustrates one embodiment of a two-phase clocking scheme used for series connected latches.
Figure 7B:
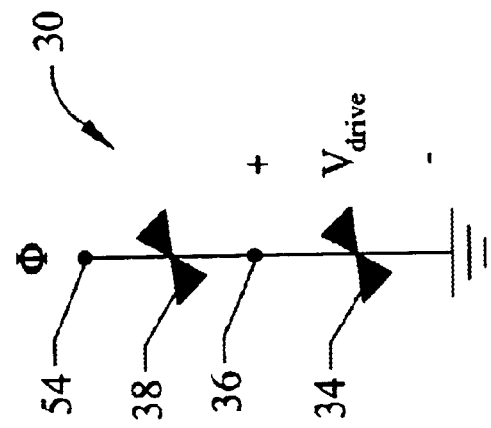
FIG. 7B illustrates one embodiment of a molecular latch being driven by a two-phase clock signal.

FIG. 7A is a graph 70 illustrating one embodiment of the two-phase clocking scheme for driving the delay circuit 60. The two-phase clocking scheme is comprised of alternating clock phases $\Phi_1$ 72 and $\Phi_2$ 73. Because the latch data node 36 of the basic molecular latch 30 emits the correct voltage only when the latch clock signal 54 is in the high state, the two-phase clocking scheme of the delay circuit 60 illustrated by the graph 70 may be required in order to propagate a signal through the delay circuit 60. FIG. 7B illustrates one embodiment of the molecular latch 30 being driven by the two-phase clock signal input 54. FIG. 7C illustrates the load-line diagram 74 of the latch 30 corresponding to voltages $V_{bias}$ and $V_{msp}$.

Those skilled in the art will appreciate that the lack of I/O isolation provided by transistors can be problematic for the latch 30 comprised solely of the RTD drive 36 and RTD load 38 pair. Without intervening devices, all data nodes 36 must exist at the same voltage, and even with additional linear circuit elements current is free to flow backwards to set upstream latches in a combination circuit. One embodiment of the present invention provides several additional devices incorporated with the RTD drive 36 and the RTD load 38 pair latch 30 in order to provide the necessary isolation characteristics.

Figure 8:
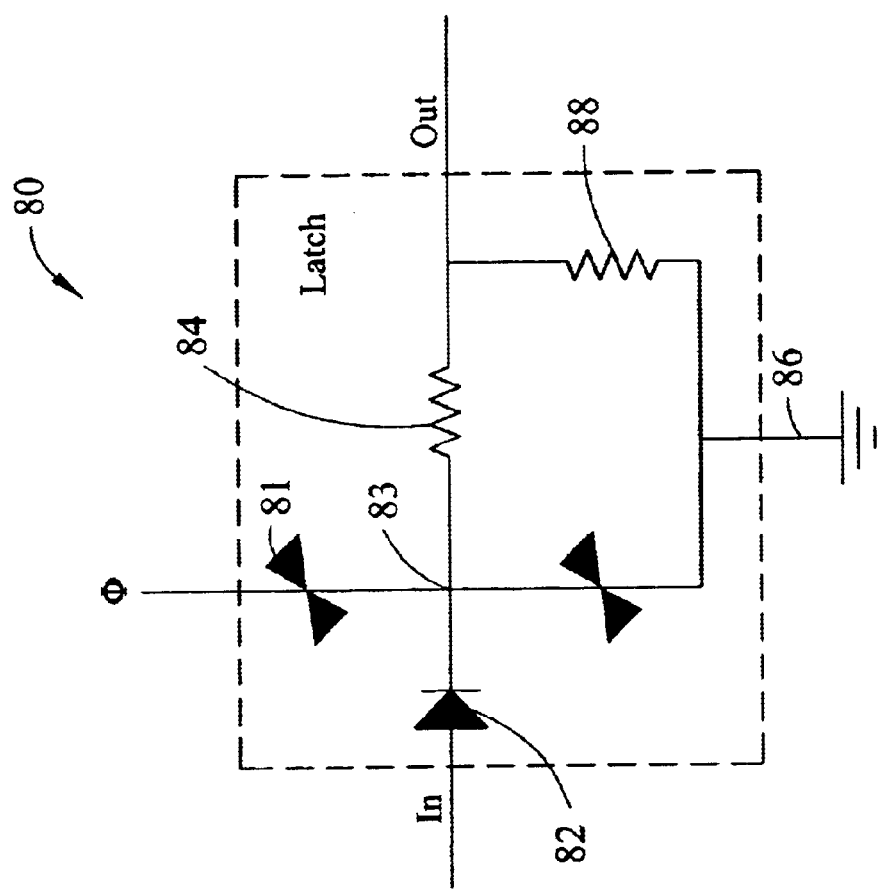
FIG. 8 illustrates one embodiment of a complete molecular latch.

FIG. 8 illustrates one implementation a latch 80 incorporating such intervening devices to provide isolation characteristics. A molecular-scale diode 82 is added to the input of the latch to prevent current from a downstream latch from flowing to set an upstream latch. Without the diode 82, setting a downstream latch will prevent the immediately upstream latch from resetting properly. Molecular diodes 82 with very low voltage drops and reverse current flow have been realized. The resistor 84 immediately following the latch data node 83 prevents a low-resistance path to ground 86 from forming between the load RTD 81 and the remainder of the circuit. If such low-resistance path is formed, current flow through the drive RTD 81 would be reduced significantly and the latch 80 would be unable to enter the logic "1" state.

The reason for providing the additional resistor 88 to ground can be understood with reference to the delay latch 60 circuit shown in FIG. 6A comprising the latch 80, and the circuit state timing diagram illustrated in the graph 70 (In=Low, D1=Low, D2=High, D3=High) shown in FIG. 7A, at the instant just before the $\Phi_2$ clock cycle. Accordingly, as the $\Phi_2$ clock voltage is lowered to $V_{msp}$, the diodes 82 (not shown) in both second and third latches 64 and 66 are reverse biased, thus preventing any current discharge from the capacitance of the second latch 64. Because discharge is necessary for the second latch 62 to enter the logic "0" state, a path to ground 86 is provided through a large resistor 88. The value of the resistor 88 may be large to prevent current loss that would otherwise cause a latch setting failure. Nevertheless, the resistor 88 may be as small as is feasible so that the reset time of the latch 80 is as short as possible.

Figure 9A:
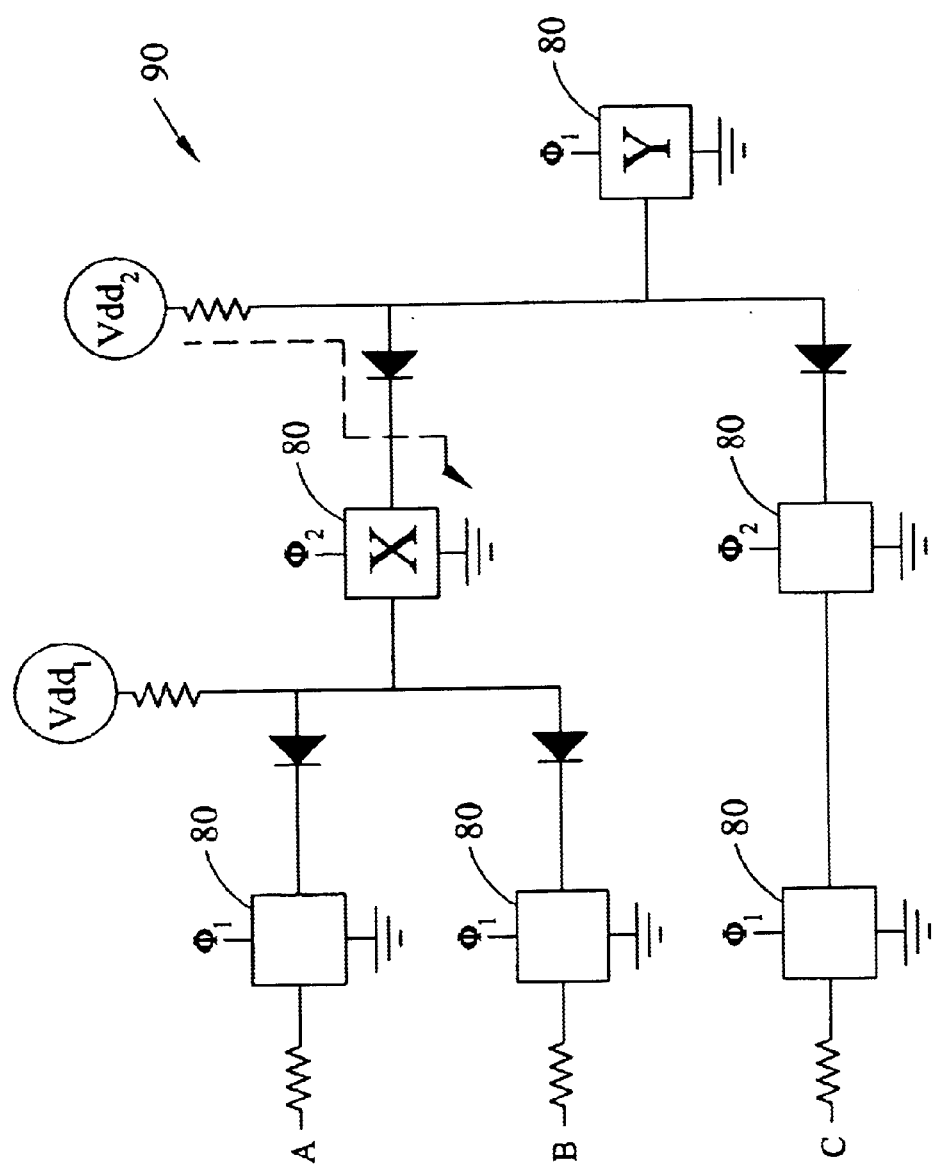
FIG. 9A illustrates one embodiment of an AND logic circuit using diode-resistor logic and intermediate molecular latches.
Figure 9B:
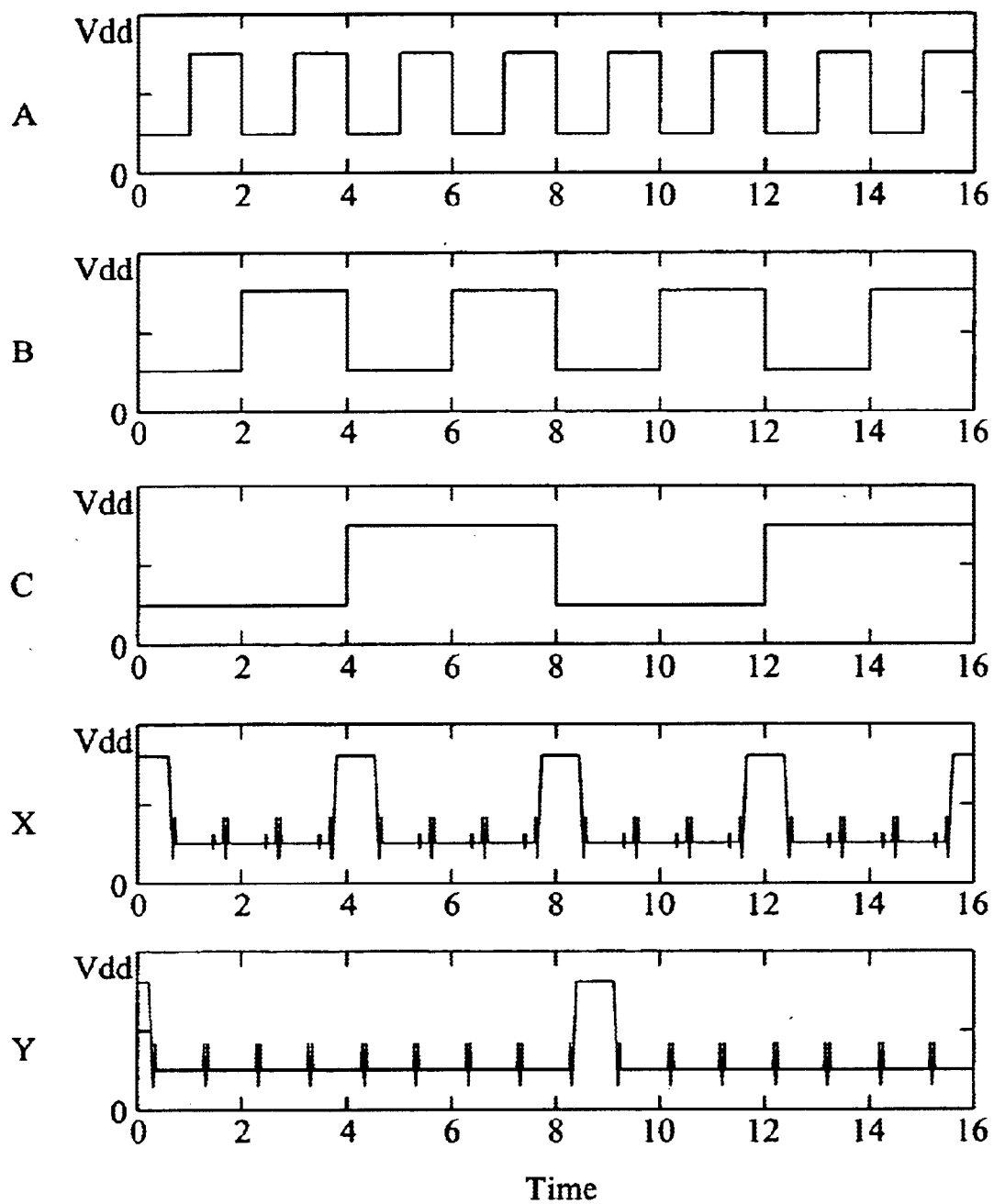
FIG. 9B illustrates one embodiment of a timing diagram for the AND logic circuit illustrated in FIG. 9A.
Figure 10A:
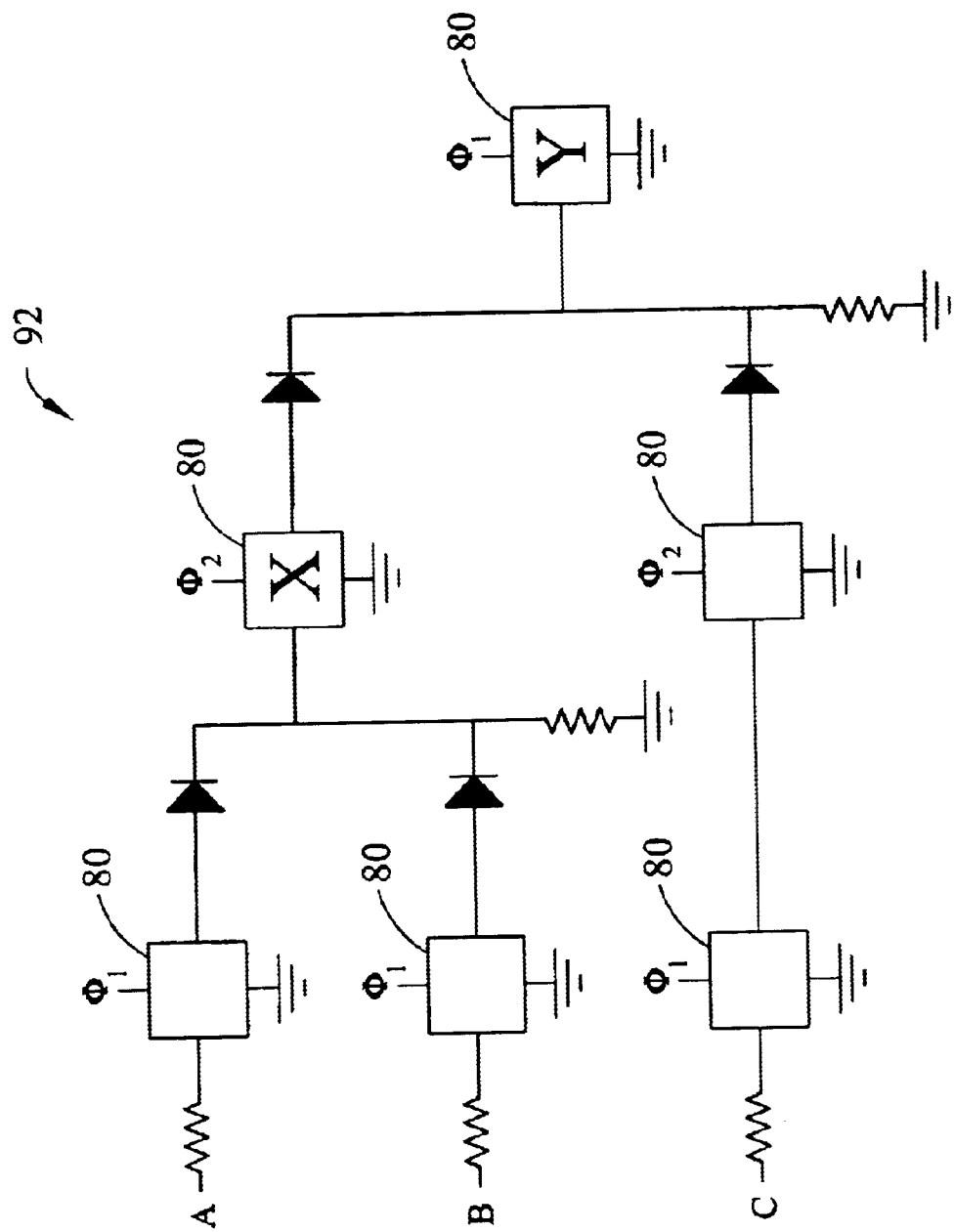
FIG. 10A illustrates one embodiment of an OR logic circuit using diode-resistor logic and intermediate molecular latches.
Figure 10B:
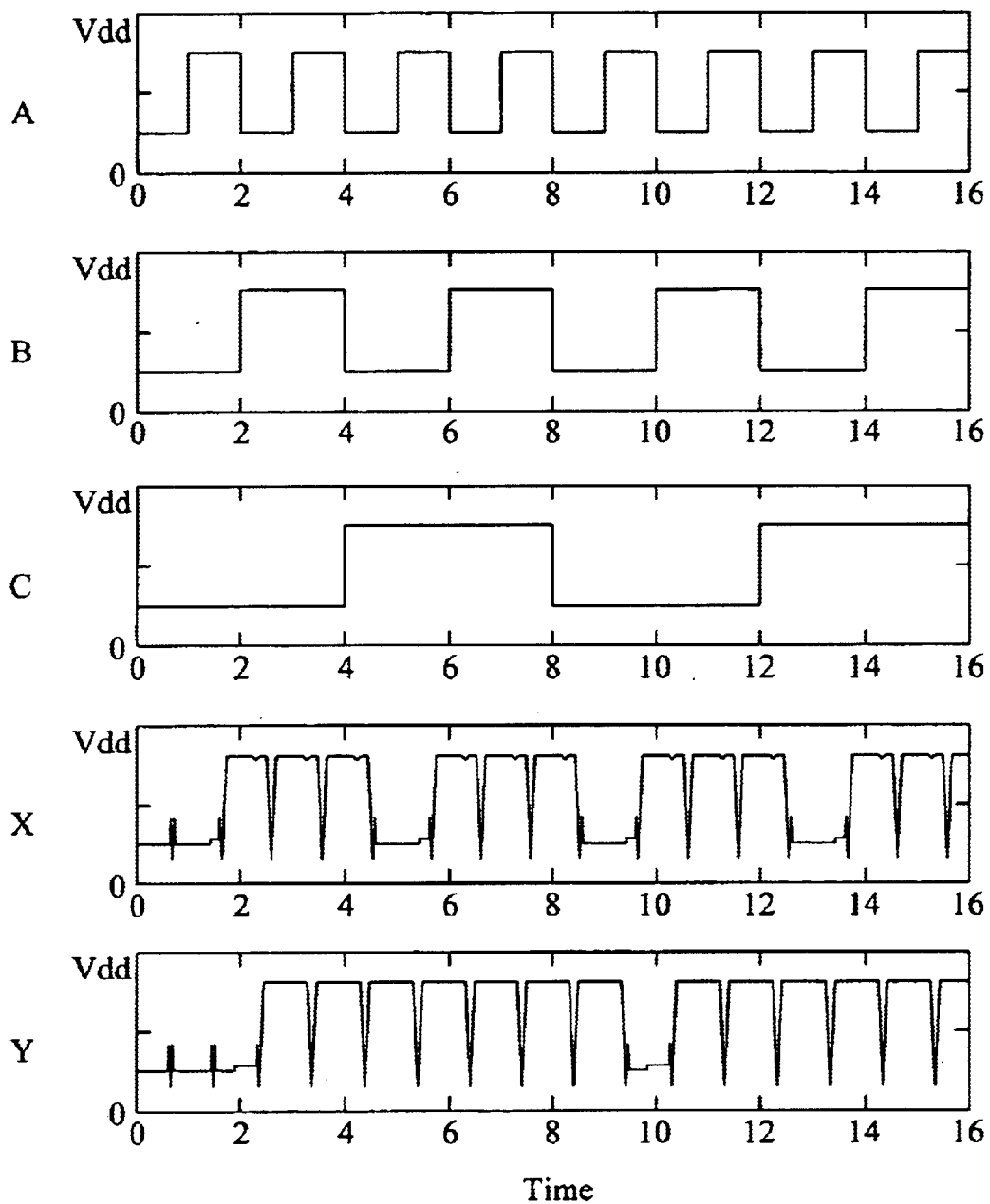
FIG. 10B illustrates one embodiment of a timing diagram for the OR logic circuit illustrated in FIG. 10A.
Figure 11A:
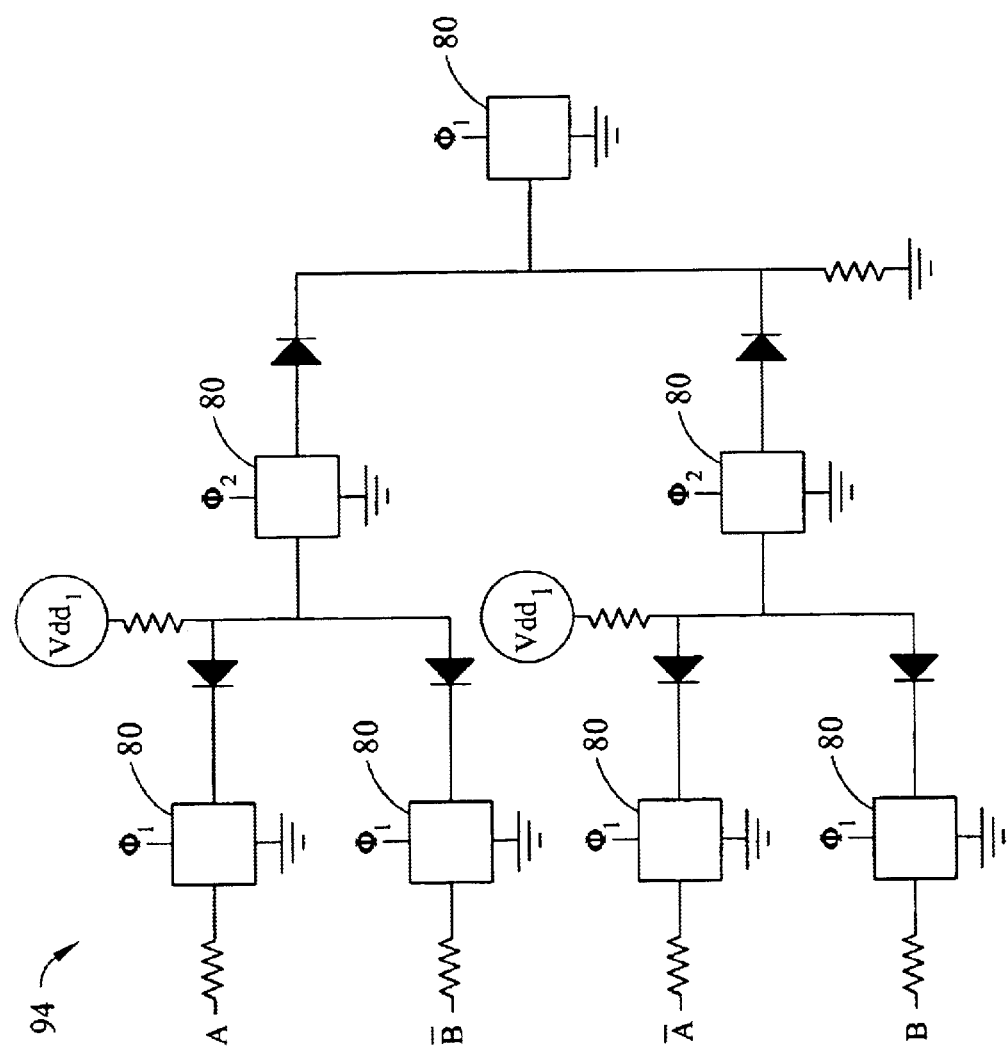
FIG. 11A illustrates one embodiment of an XOR logic circuit using diode-resistor logic and intermediate molecular latches.
Figure 11B:
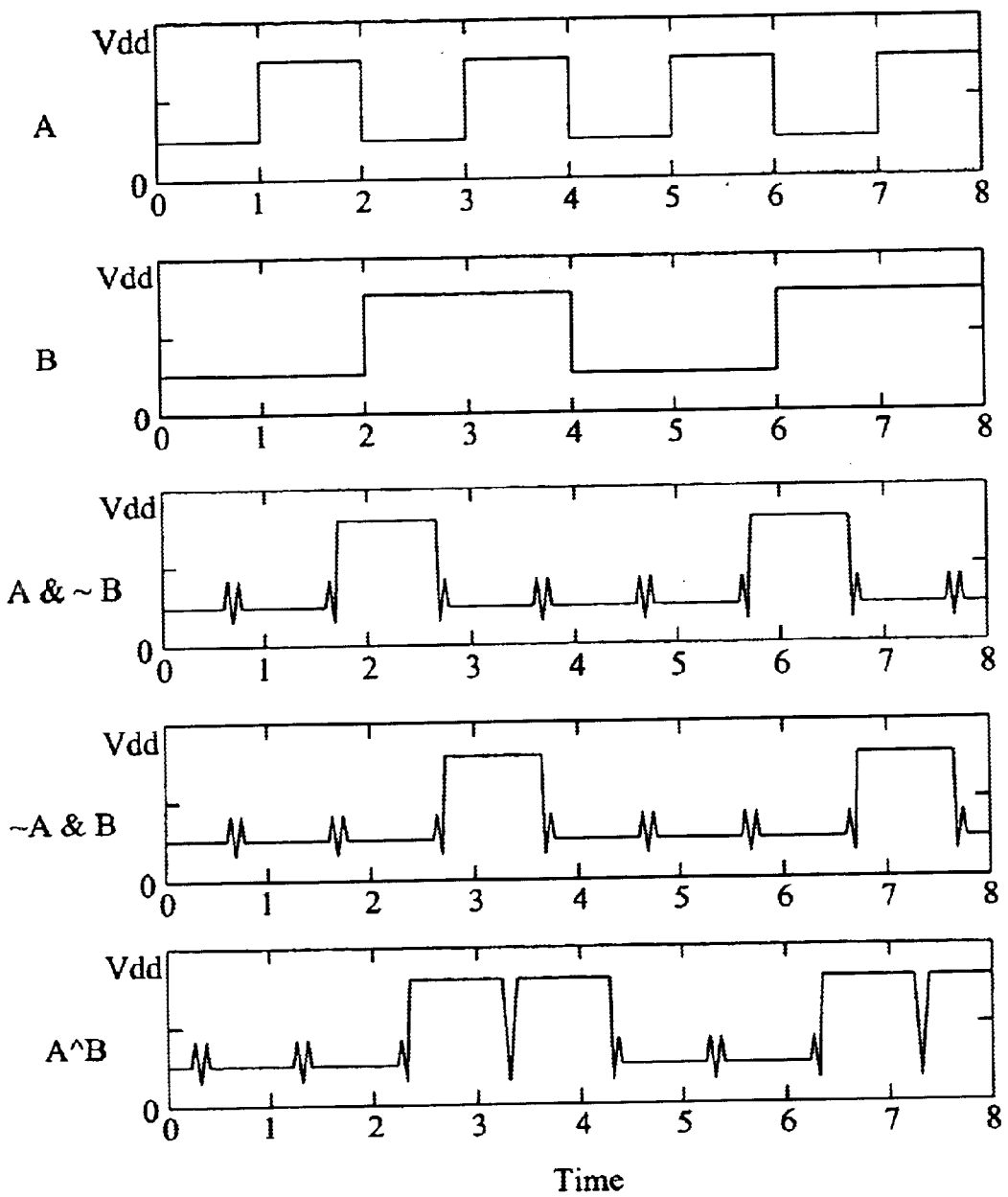
FIG. 11B illustrates one embodiment of a timing diagram for the XOR logic circuit illustrated in FIG. 11A.

Several circuits have been simulated using the above described latch 80 configuration, including the delay circuit 60 and the logic AND circuit 90 shown in FIG. 9A, the logic OR circuit 92 shown in FIG. 10A, and the logic XOR circuit 94 shown in FIG. 11A. Each logic circuit 90, 92, 94 calculates a logic value based on the logic state appearing at its input terminals taking into account the delay required to traverse the intervening latches 80. Other logic circuits having more logic levels have also been simulated successfully and are also realizable using the latch 80. FIG. 9B illustrates a simulation timing diagram 91 corresponding to the logic AND circuit 90. FIG. 10B illustrates a simulation timing diagram 93 corresponding to the logic OR circuit 92. FIG. 11B illustrates a simulation timing diagram 95 corresponding to the logic XOR circuit 94.

Figure 12:
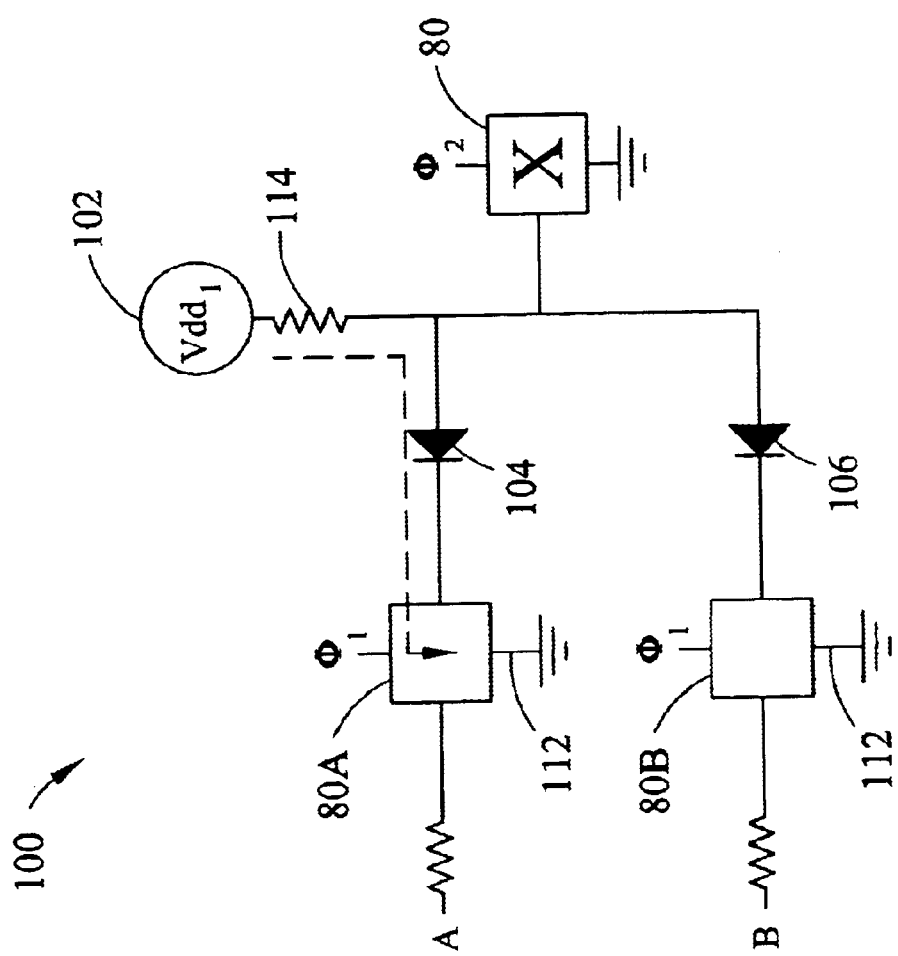
FIG. 12 illustrates one embodiment of an AND logic circuit without I/O isolation.

FIG. 12 illustrates a logic circuit 100 that forms a portion of the AND circuit 90 showing the current flow immediately before the $\Phi_1$ clock signal begins its cycle. The current in $V_{dd1}$ 102 will flow through the AND diodes 104, 106 into the latches 80A, 80B and to ground 112, preventing them from being reset. The latches 80A, B cannot be protected by a diode to prevent this, because doing so would not leave a path to sink current from the pull-up voltage. Without a path to ground 112, the pull-up resistor 114 would cause the output to be set high incorrectly. To counteract this behavior, a clocking scheme can be introduced to the logic circuit 100 for the pull-up voltage as well. For example, the pull-up voltage can be temporarily brought to ground during the MBT of the preceding latch. This would remove the forward influence and would allow the latches to be set properly.

In other words, a method for providing I/O isolation is a careful combination of clock and power management. The I/O isolation technique generally works for any circuit that is based on registers (e.g., latches or flip-flops). For example, when a register is being set, the downstream portion of the circuit is "turned off." By turning off the downstream portion of the circuit, the register is isolated from being set from the rest of the circuit. Therefore, the effects of I/O isolation are obtained without actually requiring the device to possess the characteristics of I/O isolation in and of itself.

Latch Summary

In simulation, the molecular latch 30 is capable of restoring voltage levels to the two stable values and providing current input, as determined by the I-V curve of the underlying RTD forming the latch 30. As long as the drive RTD 34 can be reliably made more resistive than the load RTD 38, the latch 30 may be stable with respect to manufacturing variability. Because of the relatively low current required to switch states, one molecular latch 30 can drive several other latches. When used in combination with the clocking scheme described hereinbefore, the latch 30 can be modified to the latch 80 to provide the necessary I/O isolation to ensure proper calculation.

Those skilled in the art will appreciate, however, that the RTD devices developed thus far are very resistive and the RC constant for circuits incorporating them is relatively long (on the order of hundreds of nanoseconds). Also, it may be desirable to control the relative sizes of the various resistors during the manufacturing process to ensure that they are properly matched. This matching will ensure that more devices attain proper I/O isolation while not adversely affecting the time constants for the circuit.

Although the complete molecular latch 80 achieves a certain degree of I/O isolation by using a combination of diodes 82 and matched resistors 84, 88, it does not provide true isolation. The path to ground through the load RTD 34 may cause incorrect setting of the latch unless care is taken to avoid forward influence. One solution to this problem is to provide a clocked pull-up voltage. Nevertheless, those skilled in the art will appreciate that other methods of providing the necessary degree of I/O isolation can be achieved without departing from the scope of the present invention.

Manufacturing Defects in the Molecular Circuit

Defects in the molecular circuits will generally fall into several categories. The most onerous group is the stuck-closed defects. In order to limit these types of defects the devices and the manufacturing process have to be appropriately engineered. It may also be necessary to engineer the process to increase the probability of stuck-open faults so as to limit the stuck-closed faults.

Current methods for detecting defects, such as those used in Teramac custom computer, do not scale to devices with $10^{10}$ configuration bits. See W. B. Culbertson, R. Amerson, R. Carter, P. Kuekes, and G. Snider, "The Teramac Custom Computer: Extending The Limits With Defect," Proc. IEEE International Symposium on Defect and Fault Tolerance in VLSI Systems, 1996. Nor do they scale to defect densities greater than one or two percent. Thus, those skilled in the art will appreciate that novel defect mapping techniques which support parallel defect detection can be developed without departing from the scope of the invention. In one embodiment of the present invention, the actual molecular chip can be configured to control the defect mapping process and to configure itself.

Furthermore, in one embodiment of the present invention, the configuration process itself can include individually addressing each configuration bit. This, however, may require that the configuration information come from micron-scale wires. Thus, some form of size matching through the use of multiplexers may be required to allow a few micron-scale wires to address many nanoscale wires.

The use of latches to provide signal restoration may introduce pipelining in all circuits. Those skilled in the art will appreciate that certain circuit techniques can be adapted in order to account for and overcome the latency introduced by this pipelining.

Architecture

One embodiment of the present invention provides an architecture based on CAEN that is designed to overcome the constraints associated with directed assembly of nanometer scale components while exploiting the advantages of molecular electronics. Because the fabrication process is fundamentally non-deterministic and prone to the introduction of defects, the device may be reconfigurable and amenable to self-testing. This will allow the characteristics and defects of each device to be discovered, support the creation of circuits that avoid the defects, and fully exploit the available resources. In one embodiment of the present invention, the fabrication processes may produce simple, regular geometries. Therefore, proposed architectures may be built out of simple, two-dimensional, homogenous structures. Rather than fabricating complex circuits, reconfigurability of the fabric can be used to implement arbitrary functions post-fabrication. The construction process also can be performed in parallel; heterogeneity, however, can be introduced only at a lithographic scale. The resulting devices will resemble Field Programmable Gate Arrays (FPGAs) in that they can be configured (and reconfigured) to implement any circuit in the field, but have several orders of magnitude more resources. Electronic nanotechnology is quickly progressing and promises incredibly small, dense and low-power devices.

Figure 13:
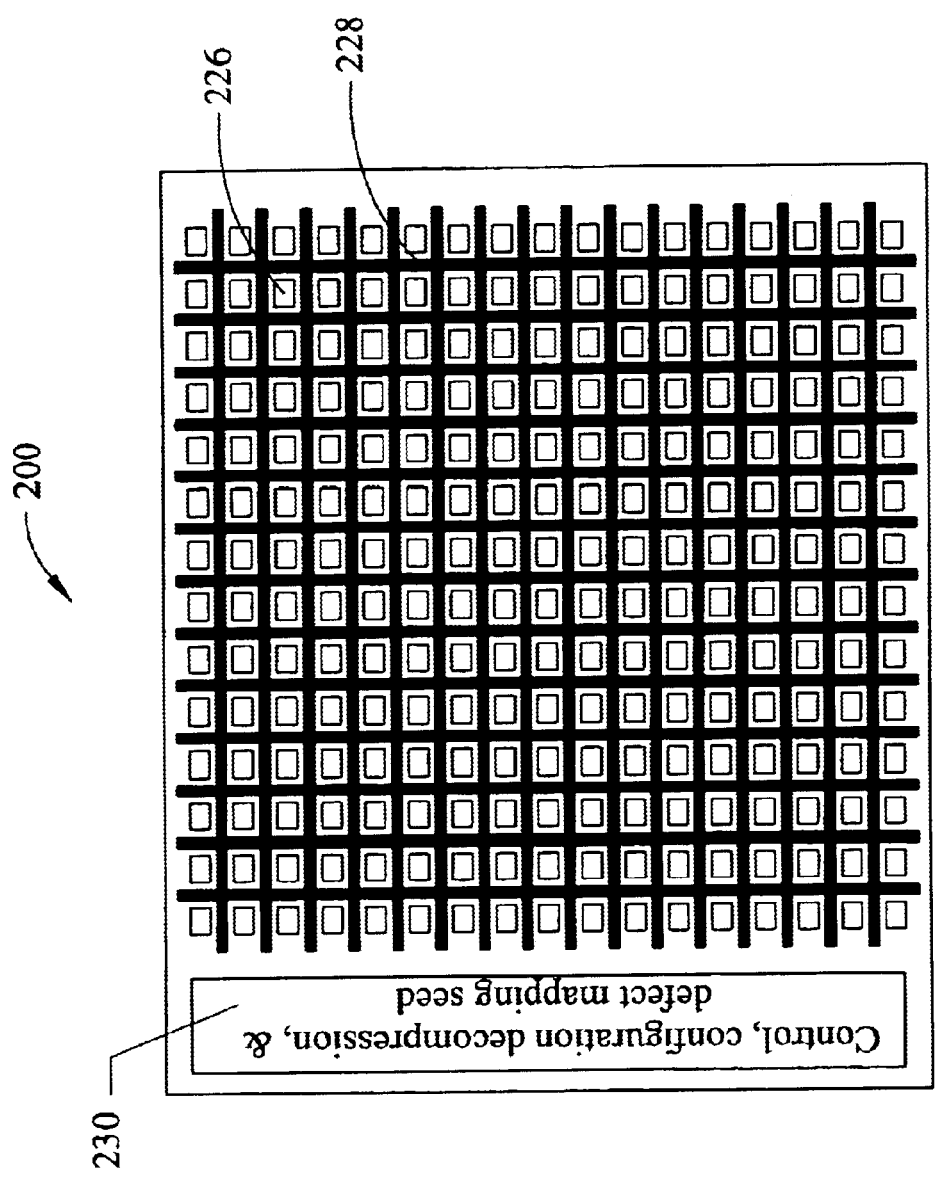
FIG. 13 illustrates one embodiment of an architecture comprising a nano-fabric based on chemically assembled electronic nanotechnology (CAEN)

FIG. 13 illustrates an architecture comprising a nano-fabric 200 based on CAEN according to one embodiment of the present invention. The nano-fabric 200 is designed to harness the smallness of electronic nanotechnology and to overcome some limitations introduced by chemical assembly. For example, it eliminates the need for transistors, the necessity of precise alignment and placement of wires, and provides for defect tolerance. In conjunction with CMOS support circuitry the nano-fabric 200 may form a reconfigurable fabric having more than $10^{10}$ gate equivalents/cm$^2$. The nano-fabric 200 is a nanoscale layer having a highly regular pattern provided on top of a CMOS layer. The nano-fabric 200 also comprises a plurality of clusters 226 in which a plurality of nanoblocks are organized into a plurality of long lines 228 adjacent to each cluster 226. In one embodiment, the nano-fabric 200 can include $10^6$ clusters 226 and $10^8$ long lines 228. The nano-fabric 200 also comprises a control, configuration decompression, and defect mapping seed portion 230.

The main computing element in the nano-fabric 200 is a molecular-based reconfigurable switch. The reconfigurable nature of the nano-fabric 200 is exploited to provide defect tolerance and to support reconfigurable computing. Reconfigurable computing provides not only increased performance, but amortizes the cost of chip manufacturing across many users by allowing circuits to be configured post-fabrication. The molecular-based switch may eliminate much of the overhead needed to support reconfiguration. Because the molecular switch holds its own state and can be programmed without using extra wires, nano-fabrics 200 may be well suited for reconfigurable computing. In one embodiment, the nano-fabric 200 can be implemented as a combination of CMOS technology and CAEN technology, thus providing a hybrid architecture that may combine silicon-based custom circuits with CAEN-based reconfigurable circuits.

To support defect tolerance, ease of placement and routing constraints, and enable faster compilation, one embodiment of the present invention also provides a new architectural model, the split-phase abstract machine (SAM). SAM ensures that all operations of potentially unknown latency use split-phase operations. The compilation strategy engendered by SAM is to partition an application into independent threads at all split-phase boundaries. This partitioning allows compilers and CAD tools to handle the large designs that can fit on a nano-fabric 200. While the model is powerful enough to express parallel execution, a study of the model's performance is also described herein. The model, however, may be limited to sequential execution, and may use only simple scalar compiler optimizations. One compilation strategy produces results whose average performance is within a factor of 2.5 of the performance of an Alpha microprocessor, under the most pessimistic delay assumptions for a nano-fabric 200 implementation.

Spatial Computing

The present invention will now be described with respect to spatial computing using molecular electronics arranged as an array of interconnected nano-components or nanoblocks that form the nano-fabric 200. The exponential increases in processing power over the recent past faces imminent challenges due in part to the physics of deep submicron CMOS devices and the costs of both chip masks and future fabrication plants. Accordingly, an alternative to CMOS-based computing is the utilization of CAEN devices. The following description is of one implementation of CAEN-based computing. How CAEN devices will affect computer architecture and how the inherently reconfigurable nature of CAEN devices can be utilized to provide high-density chips with defect tolerance at significantly reduced manufacturing costs also will be described. The description includes a layered abstract architecture for CAEN-based computing devices and preliminary results indicating that such devices can be manufactured competitively with CMOS circuits.

A form of electronic nanotechnology (EN) according to one embodiment of the present invention provides CAEN technology that utilizes self-alignment to construct electronic circuits out of nanometer-scale devices. These nanometer scale devices, among other things, may take advantage of quantum-mechanical effects. Furthermore, CAEN technology, according to one embodiment of the present invention, can be harnessed to create useful computational devices with more than $10^{10}$ gate-equivalents per $cm^2$. In one embodiment of the present invention, the advantages of CAEN technology can be realized by substituting compilation time (which is inexpensive) for manufacturing precision (which is expensive). This can be achieved through a variety of combinations of reconfigurable computing, defect tolerance, architectural abstractions, and compiler technology. The result yields a high-density low-power substrate.

One embodiment of the present invention provides an architecture based on fabricating dense regular structures, referred to as nanoblocks, that can be programmed after fabrication for implementing complex functions. As discussed above, the nano-fabric 200 is formed using an array of interconnected nanoblocks.

Compared to CMOS, CAEN-based devices may have a higher defect density. Accordingly, such circuits may require a built-in defect tolerance. In one embodiment of the present invention, one method of handling such defects is to first configure the nano-fabric 200 for self-diagnosis and then to implement the desired functionality by configuring around the defects. Reconfigurability is thus one integral aspect to the operation of the nano-fabric 200. The nature of the defects may make the nano-fabric 200 particularly well suited for reconfigurable computing.

Figure 14:
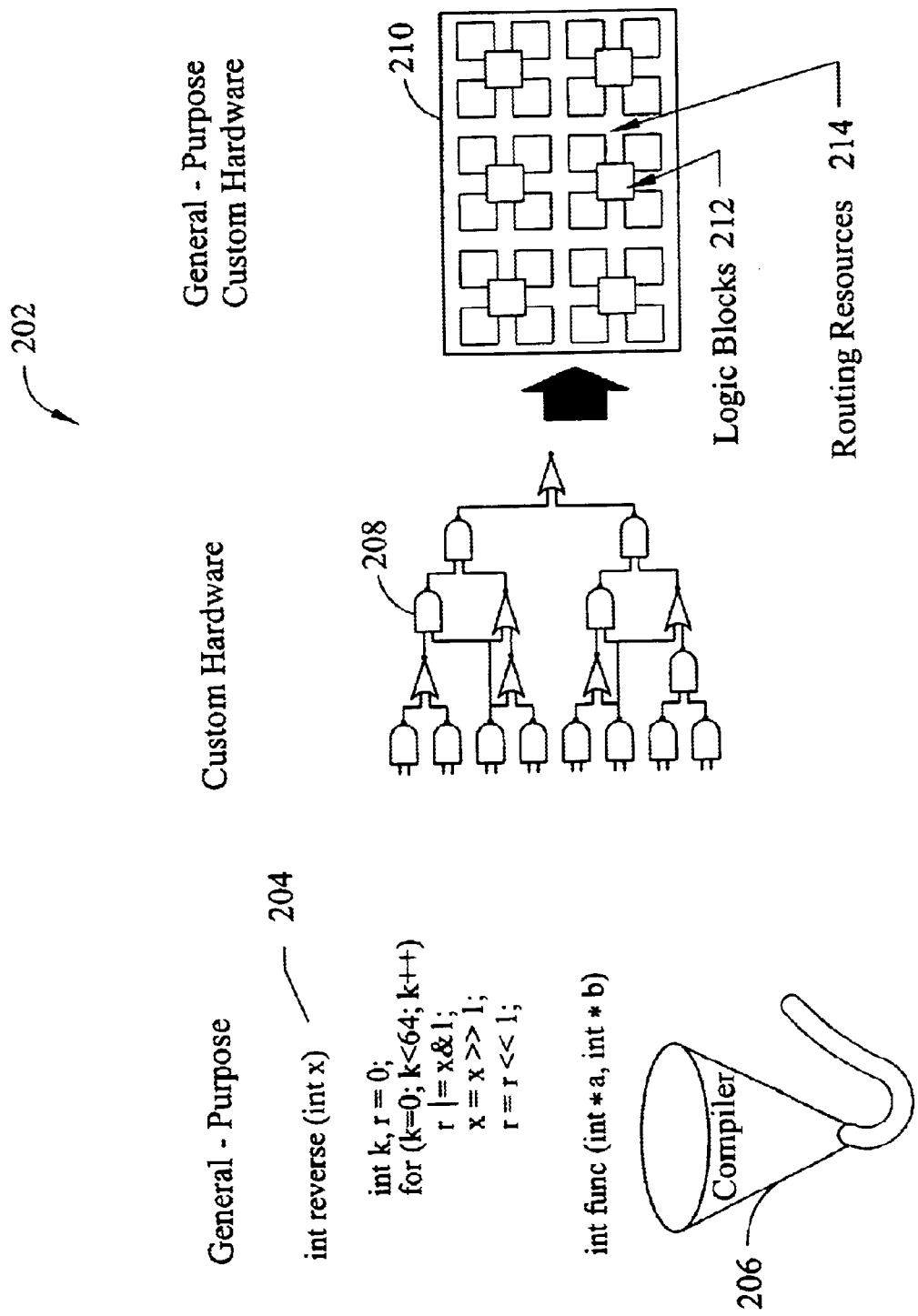
FIG. 14 illustrates in principle one embodiment of the reconfigurable computing nature of one embodiment of the present invention.

FIG. 14 shows one example block diagram 202 illustrating in principle the reconfigurable computing nature of one embodiment of the present invention. The process combines general-purpose instructions 204 via a compiler 206 with custom hardware 208 to arrive at a general-purpose custom hardware array 210 of logic blocks 212 interconnected by a plurality of routing resources 214. Reconfigurable computing changes the function of programmable logic blocks 212 and their connecting resources 214 to build efficient, highly parallel processing kernels, as may be needed to tailor an application under execution. A network of processing elements is referred to as a reconfigurable fabric, such as the nano-fabric 200 discussed hereinbefore. The data used to program the interconnecting and processing elements are called a configuration. One advantage of nano-fabrics 200 over CMOS-based reconfigurable fabrics is that the chip area overhead for supporting reconfiguration may be virtually eliminated. This magnifies the benefits of reconfigurable computing and yields computing devices that may outperform conventional devices by orders of magnitude as measured with respect to many metrics, such as computing elements per $cm^2$, operations per watt, and the like.

The description of one embodiment of the present invention that follows also presents research results indicating that CAEN technology can be utilized for implementing reconfigurable computing devices. The description also provides an analysis of how the unique features of the CAEN devices can be exploited, and how their limitations can be circumvented. An architecture that utilizes the capabilities of CAEN devices without requiring extraordinary fabrication technology is also described. Also provided is a description of a top-level architectural abstraction, and the Split-Phase Abstract Machine (SAM), which enables fast compilation of large programs. Also described are results from a simulation indicating that the SAM abstraction does not hide the efficiency of the nano-fabric 200.

Electronic Nanotechnology

While CMOS fabrication will soon hit certain limits due to a combination of economic and technical factors, such as ultrathin gate oxides, short channel effects, and doping fluctuations, technology is nowhere near the theoretical limits of physical computation. One way of achieving these limits at room temperature is to operate in the nano-scale regime, which currently involves various technologies that exploit the quantum-mechanical effects of small devices. Among these are single-electron transistors, nanowire transistors, quantum dots, quantum cellular automata, resonant tunneling devices, negative differential resistors (NDR), and reconfigurable switches. In all cases, the fabricated devices are on the order of a few nanometers. Given the small sizes involved, one method of creating and connecting these devices is by way of self-assembly and self-alignment instead of lithography.

Although the description of one embodiment of the present invention is mainly centered on molecular devices having I-V characteristics similar to those of their bulk counterparts, the scope of the present invention should not be limited thereto. For example, although the basis of rectification is different between a silicon-based p-n junction diode and a molecular diode, they both have similar I-V curves. Accordingly, the present invention describes systems that can be built from nanoscale devices having bulk semiconductor analogs to capitalize on: (1) available experience with standard circuits to the system; and (2) available standard modeling tools to model the system such as SPICE, for example. Recent advances in creating fully functional electronic nanotechnology ((EN) computing devices indicate that EN could be a very successful post-CMOS technology for implementing computing devices. Advances also have been made in creating wires out of single-wall carbon nanotubes and aligning them on a silicon substrate. Even more practical is the fabrication of metal nanowires, which scale down to 5 nm and can include embedded devices. Combined, these advances may provide the technological background for harnessing CAEN for computing in the post-CMOS age.

CAEN devices are very small: for example, a single CAEN RAM cell requires about 100 $nm^2$ as opposed to 100,000 $nm^2$ for a single laid out CMOS transistor. For example, those skilled in the art will appreciate that a CAEN device can be realized using nanowires that are on 10 nm centers. A CMOS transistor with a 4:1 ratio in a 70 nm process, (even using Silicon on Insulator, which does not need wells) with no wires attached measures 210 nm×280 nm. Further, attaching minimally sized wires to the terminals increases the size to 350 nm×350 nm. Accordingly, a simple logic gate or a static memory cell requiring several transistors, separate p- and n-wells, etc., will result in a factor of $10^5$ difference in density between CAEN and CMOS devices. CAEN devices use much less power, since very few electrons are required for switching.

CAEN devices may be better suited for reconfigurable computing than CMOS or floating-gate technology because the configuration information for a switch does not have to be stored in a device separately from the switch itself. A CMOS-based re-configurable device requires a static RAM cell to control each pass transistor and two sets of wires are needed in CMOS: one for addressing the configuration bit and one for the actual signals. Floating-gate technology stores the configuration information at the transistor itself. Like traditional transistors, floating-gate transistors also require two sets of wires. Furthermore, a CAEN switch behaves like a diode, but a floating gate transistor is bi-directional, and thus may be less useful for building programmable logic.

In contrast, EN provides small, dense, and low-power devices and provides opportunities for exploring new manufacturing methods and processes. Accordingly, manufacturing EN devices may require post-fabrication reconfiguration to determine the properties of the device and to avoid defects rather than traditional deterministic methods.

Fabrication and Architectural Implications

One embodiment of the present invention will now be described with respect to a fabrication process. In one embodiment of the present invention the fabrication process is hierarchical, proceeding from basic components (e.g., wires and switches) through self-assembled arrays of components, to complete systems. In a first step, wires of different types are constructed through chemical self-assembly. Those skilled in the art will appreciate that chemical self-assembly refers to a process by which the EN components (e.g., wires or devices) are synthesized and connected together through chemical processes. A next step aligns groups of wires. Also, through self-assembly, two planes of aligned wires can be combined to form a two-dimensional grid having configurable molecular switches at the intersection points. In one embodiment of the present invention, the resulting grids are on the order of a few microns. A separate process can be used to create a silicon-based die using standard lithography. The circuits on the silicon die provides power, clock lines, an I/O interface, and support logic for the grids of switches. In one embodiment of the present invention, the die contains "holes" in which the grids are placed, aligned, and connected with the wires on the die.

Using only self-assembly and self-alignment may restrict the manufacturing to simple, regular structures, such as, rafts of parallel wires or grids composed of orthogonal rafts.

A post-fabrication configuration is used to create useful circuits as described below. Further, the small size and non-deterministic nature of the self-assembly process may also give rise to high defect densities, which can be bypassed through re-configuration as described below.

In one embodiment, therefore, CAEN devices are utilized for performing logic functions using two terminal devices such as, for example, diode-resistor logic. As the active components will be diodes and configurable switches, there will generally be no CAEN inverters. Accordingly, all logic functions will generally compute both the desired output and its complement.

Furthermore, the lack of a CAEN transistor means that special mechanisms are required for signal restoration and for building registers. Nevertheless, using a CMOS device to buffer the signals may be unattractive for two reasons. First, CMOS transistors are significantly larger and would decrease the density of the nano-fabric 200. Second, the large size of CMOS transistors would slow down the nano-fabric 200. Accordingly, one embodiment of the present invention provides a molecular latch using principles analogous to tunnel diodes. In one embodiment, the latch comprises a wire with two inline NDR molecules at either end forming the latch 80. The latch 80, combined with a clocking methodology, provides signal restoration, latching, and I/O isolation. Also, the signal-conditioning requirement results in circuits that are either slow (if transistors are used) or deeply pipelined (if latches are used).

The fabrication process also disallows the precise alignment required to make end-to-end connections between nano-scale wires. One architecture implementation according to the present invention ensures that all connections between nano-scale wires occur by crossing the wires.

Nano-Fabric

In one embodiment of the present invention, the architecture of the nano-fabric 200 is designed to overcome the constraints associated with directed assembly of nanometer-scale components and utilize the advantages of molecular electronics. Because the fabrication process is fundamentally non-deterministic and prone to introducing defects, the nano-fabric 200 may be reconfigurable and amenable to self-testing. This requires a method of discovering the characteristics of each nano-fabric 200 and then creating circuits that avoid the defects and use the available resources. Although the present invention is described with reference to fabrication processes that produce simple, regular geometries, the invention should not be limited thereto. The proposed nano-fabric 200 described herein is built out of simple, two-dimensional, homogeneous structures. Further, rather than fabricating complex circuits, the reconfigurability of the fabric is used to implement arbitrary functions post-fabrication. The construction process is also parallel; heterogeneity is introduced only at a lithographic scale. The nano-fabric 200 can be configured (and reconfigured) to implement any circuit, similar to conventional FPGAs. The nano-fabric 200, however, comprises several orders of magnitude more resources.

Figure 15:
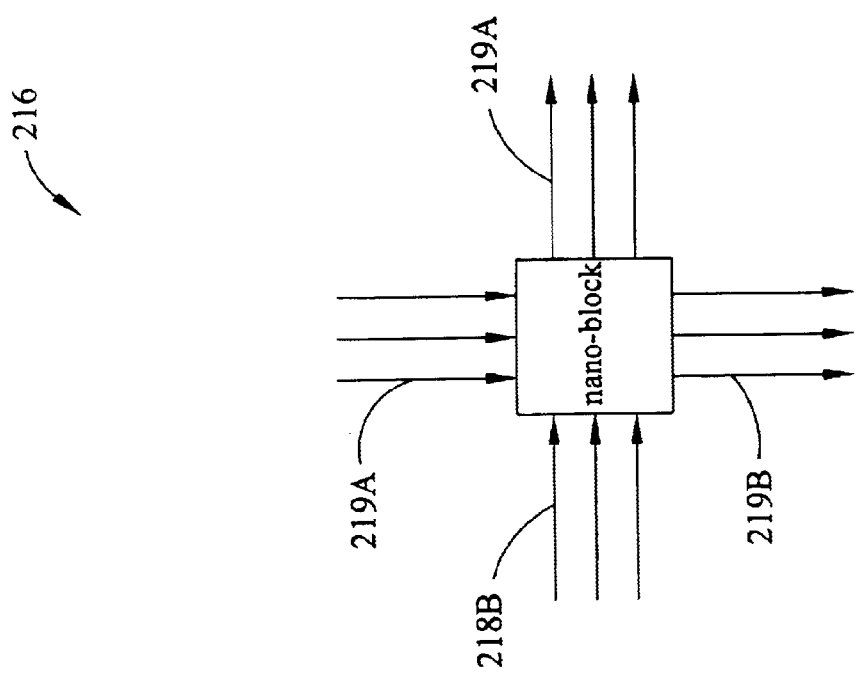
FIG. 15 illustrates one embodiment of a nanoblock.

FIG. 15 illustrates one embodiment of a nanoblock 216. The nano-fabric 200 comprises a two-dimensional mesh of interconnected nanoblocks 216. The nanoblocks 216 are logic blocks that can be programmed to implement a three-bit input to three-bit output Boolean function and its complement. The single nanoblock 216 includes a set of three I/O lines that can be manufactured using the self-assembly and self-alignment process. The I/O lines include a pair of three input lines 218A, B each and a pair of three output lines 219A, B each. The nanoblock 216 is a basic unit of logic that can be formed on a lithographic scale. The nanoblock 216 contains a relatively small number of I/O lines 218A, B/219A, B and has a south-west and north-east orientation. Internally, the nanoblock 216 comprises a matrix of reconfigurable diodes 14. The nanoblocks 216 also can be used as switches to route signals. Generally, the design of the nanoblock 216 is dictated by fabrication constraints. Each side of the nanoblock 216 can have inputs or outputs, but not both. Thus, the illustrated I/O arrangement 218A, B/219A, B may be required. The arrangement of all nanoscale wire-to-wire connections that are made between two orthogonal wires does not generally require a precise end-to-end alignment.

Figure 16:
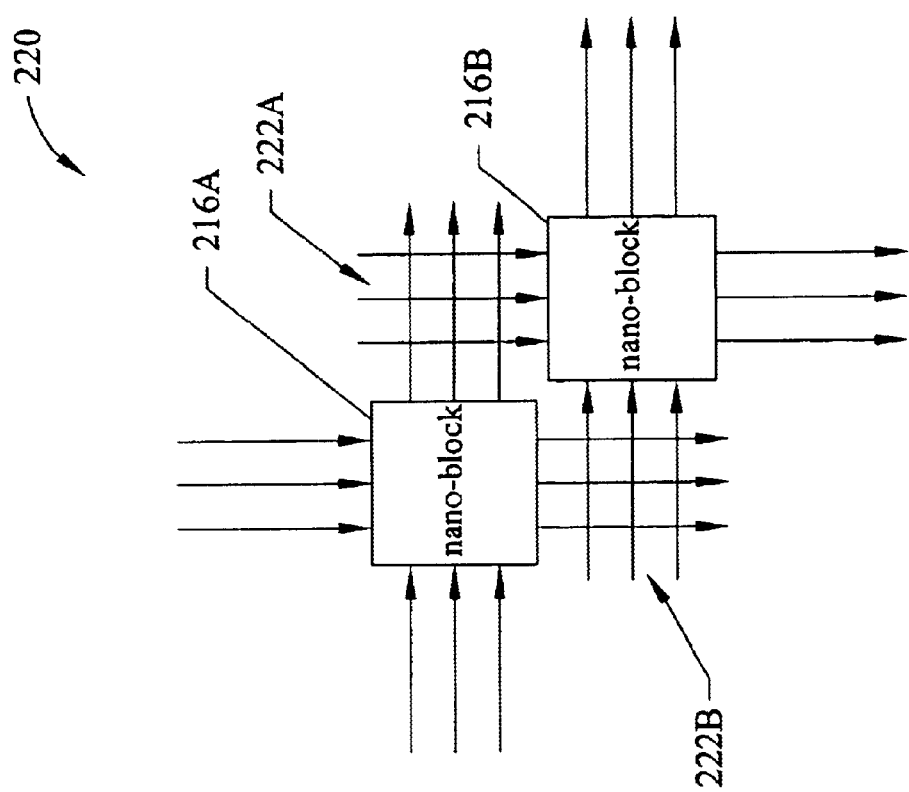
FIG. 16 illustrates one embodiment of a first and second nanoblocks forming one half of a switchblock.

FIG. 16 illustrates one embodiment of first and second nanoblocks 216A, B forming one half of a switchblock 222A, B, and shows how the outputs of the first nanoblock 216A connect to the inputs of the second nanoblock 216B. The area where two sets of I/O wires overlap is referred to as one-half of a switch block 222A, B.

Figure 17:
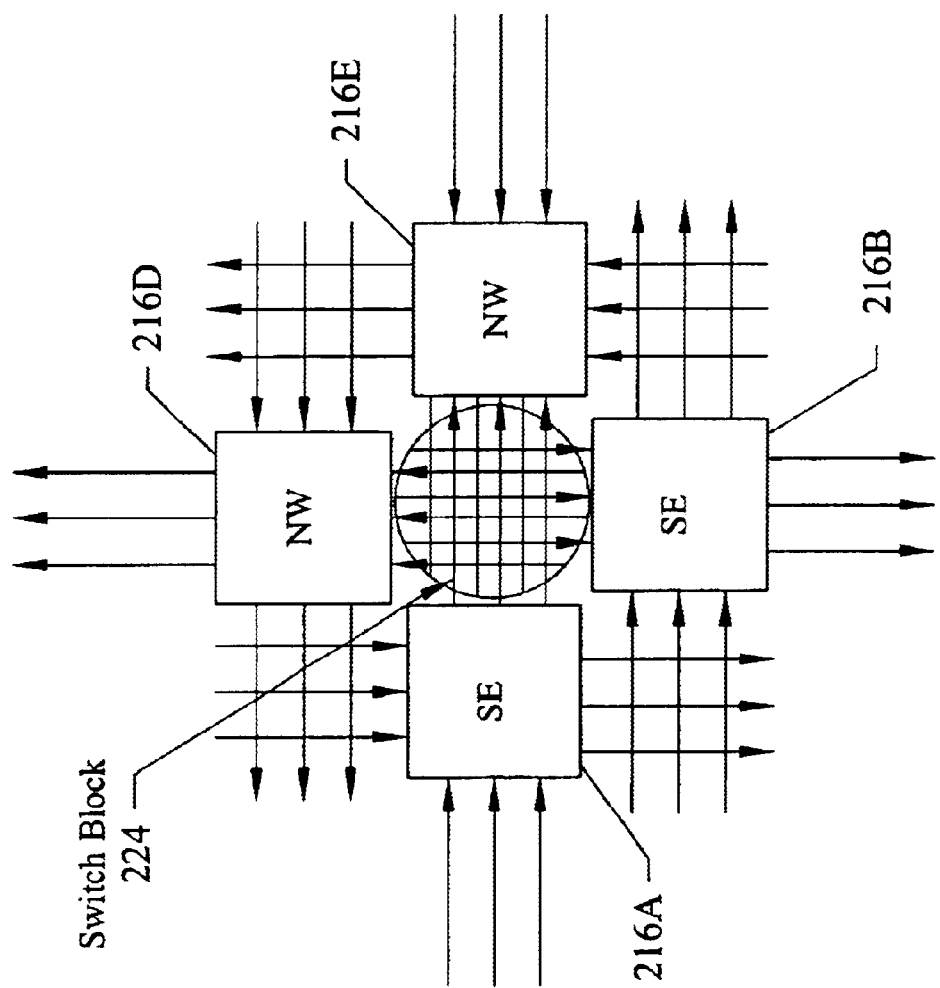
FIG. 17 illustrates one embodiment of a complete switchblock formed by four surrounding nanoblocks.

FIG. 17 illustrates one embodiment of a complete switchblock 224 formed by four surrounding nanoblocks 216A, B, C, D. The outputs of the nanoblocks 216A, B, C, D either face south and east (SE) or face north and west (NW). For example, the outputs of the nanoblocks 216A, B face south and east (SE), while the outputs of the nanoblocks 216C, D face north and west (NW). By arranging the nanoblocks 216A, B, C, D such that all the SE blocks run in one diagonal and the NW run in the adjacent diagonal, any circuit netlist can be mapped onto the nano-fabric 200. Since the nanoblocks 216A, B, C, D may be larger than the minimum lithographic dimension (e.g., greater than one micron), they can be positioned precisely at manufacturing time in the desired patterns.

Figure 18:
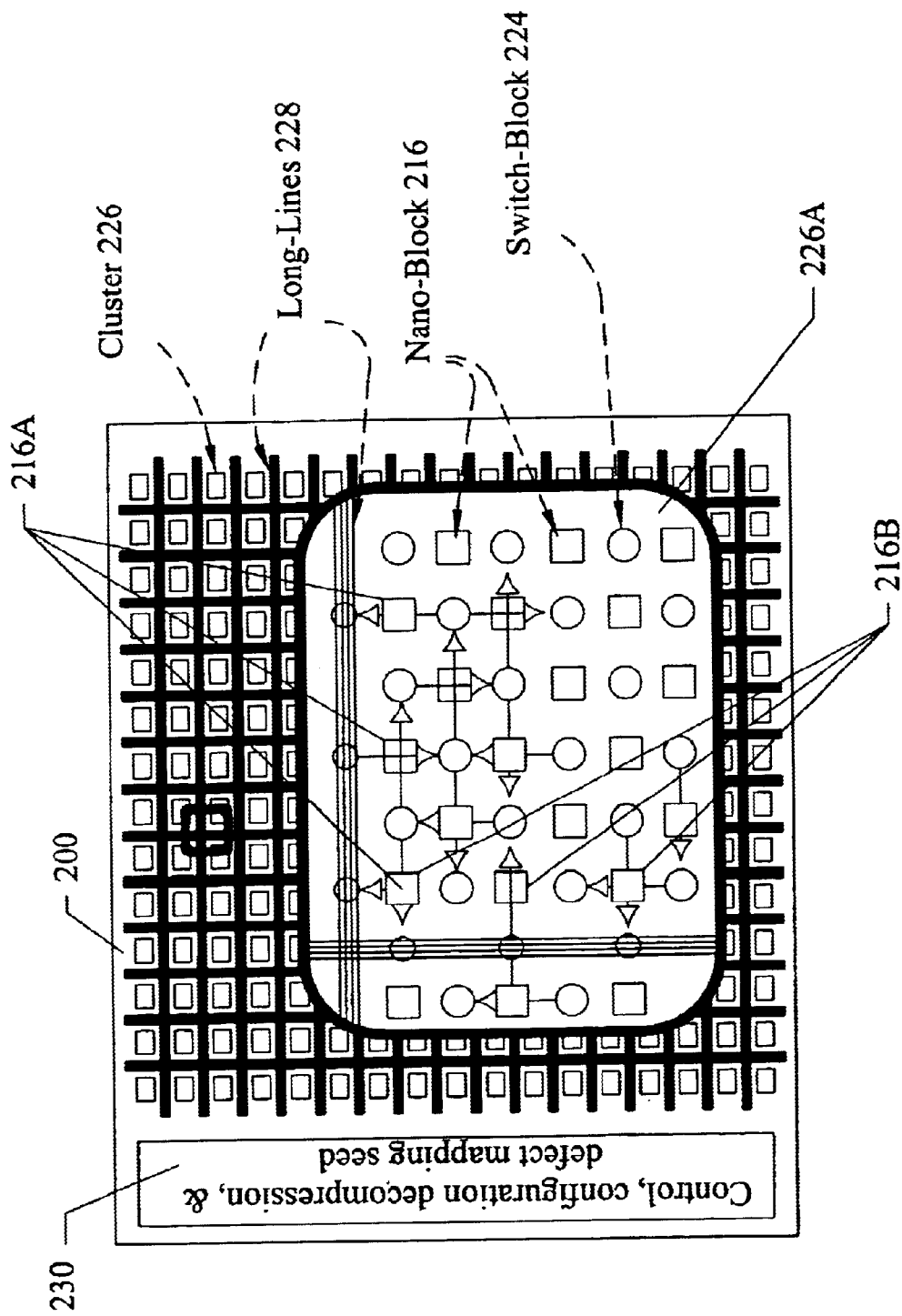
FIG. 18 illustrates one embodiment of a layout of the nano-fabric illustrated in FIG. 13.

FIG. 18 illustrates one embodiment of a layout of the nano-fabric 200 illustrated in FIG. 13 with a partial blow-up of a single cluster 226A in which the nanoblocks are organized into. The layout of the nano-fabric 200 with the partial blowup of the single cluster 226 also shows some of the adjacent long-lines 228. Within the single cluster 226A, the nanoblocks 216 are connected to their nearest four neighbors. Long wires which may span many clusters 226 (e.g., the long-lines 228), are used to route signals between the clusters 226. The nanoblocks 216A, B on the perimeter of the cluster 226A are connected to the long-lines 228. Those skilled in the art will appreciate that this arrangement is similar to conventional FPGAs and has been shown to be flexible enough to implement any circuit on the underlying nano-fabric 200.

In addition to the intra-cluster routing there are long-lines 228 that run between the clusters to provide low-latency communication over longer distances. The nanowires in these tracks may have varying lengths (e.g., 1,2,4, and 8 clusters long), allowing a signal to traverse one or more clusters 226 without going through any switches. Those skilled in the art will appreciate that this type of layout is analogous to a conventional island-style FPGA. This general layout technique has been shown to be efficient and amenable to place-and-route tools. Furthermore, all communication between nanoblocks 216 occurs at the nanoscale. In one embodiment of the present invention, there is no need to communicate between a nanoscale and CMOS components and back again and, thus, increasing the relative density of the nano-fabric 200 while lowering its power requirements.

The arrangement of the clusters 226 and the long-lines 228 promote scalability in several ways. For example, as the number of components increases, the number of long-lines 228 that run between the clusters 226 can be increased. This supports routability of netlists. Also, each cluster 226 may be configured in parallel, allowing configuration times to remain reasonable even for very large nano-fabrics 200. The power requirements remain low because molecular devices are used for all aspects of circuit operation. Furthermore, the parallel nature of chemical assembly can be utilized because the nano-fabric 200 is assembled hierarchically.

Nanoblock Schematic

Figure 19:
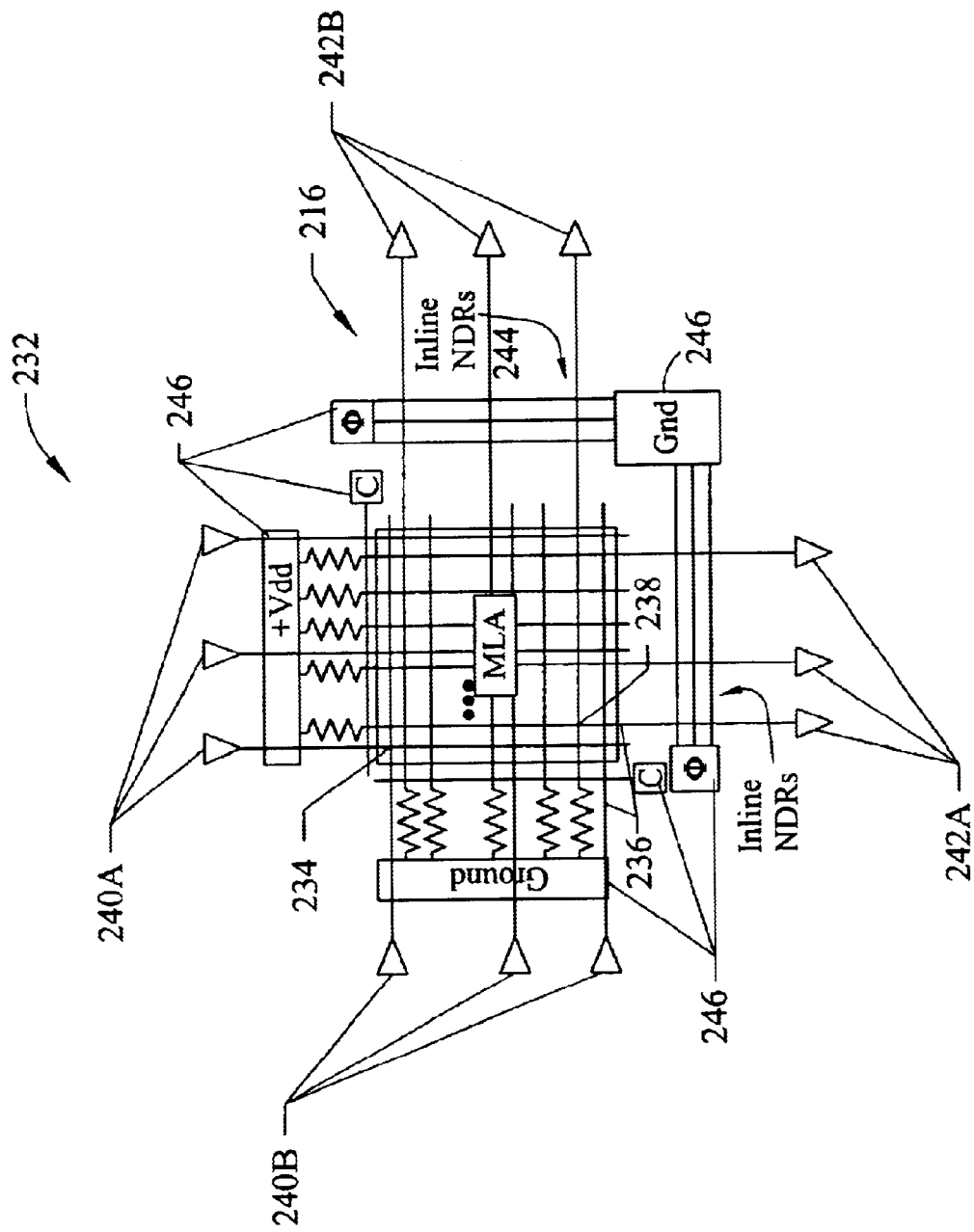
FIG. 19 illustrates one embodiment of a schematic of a nanoblock.

FIG. 19 illustrates one embodiment of a schematic 232 of a nanoblock 216. As illustrated in the nanoblock schematic 232, the +$V_{dd}$ and Ground Inputs are located on north and east portions of the nanoblock 216 while the outputs are located on the south and west portions of the nanoblock 216. The outputs of the nanoblock 216 are latched by inline NDRs 244 that also restore signals with power from the clock. The nanoblock 216 is the fundamental unit of the nano-fabric 200. The nanoblock 216 is composed of three sections: (1) the molecular logic array 234 (MLA), where the functionality of the nanoblock 216 is located; (2) the inline NDR latches 244, used for signal restoration and signal latching for sequential circuit implementation; and (3) the I/O areas 240A, B and 242A, B, used to connect the nanoblock 216 to its neighbors via the switch block 224.

The MLA 234 portion of the nanoblock 216 is composed of two orthogonal sets of wires 236. At each intersection 238 of two orthogonal wires 236 lies a configurable molecular switch. The switches, when configured to be "on," act as the diodes 14. The Inputs 240A, B are provided on the north and east portions of the nanoblock 216 and the Outputs 242A, B are provided on the south and west portions. The inline NDR latches 244 also restore signals with power from the clock latch at the Outputs 242A, B of the nanoblock 216. The regions 246 of the nanoblock 216 indicate connections from a CMOS layer. One embodiment of the present invention provides a "standard cell" library using nanoblock 216 logic circuit elements such as AND, OR, XOR, and ADDER, for example, for designing circuits for the MLA 234. This is in contrast with designing circuits for a programmable logic array, which requires an OR and an AND logic circuit plane.

Figure 20A:
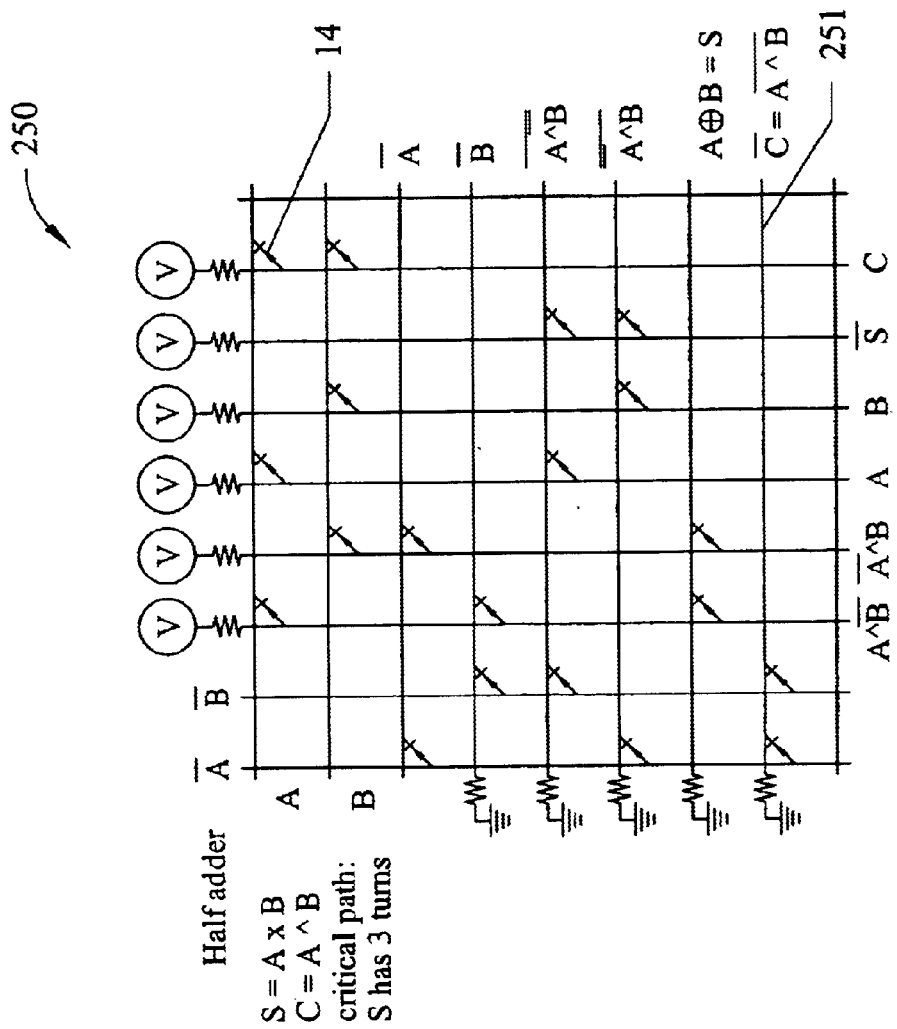
FIG. 20A illustrates one implementation for a half-adder circuit realized in a portion of a nanoblock.
Figure 20B:
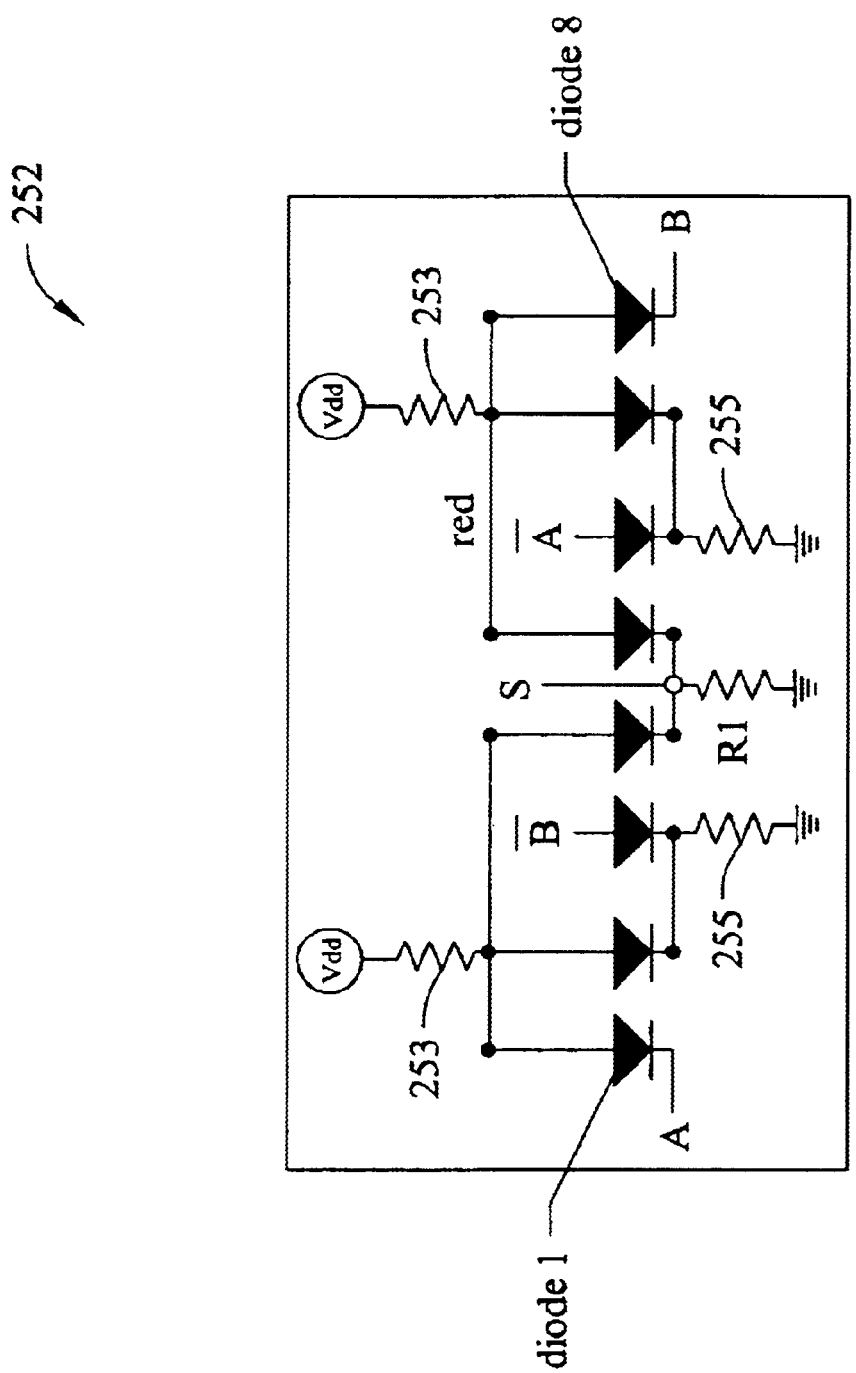
FIG. 20B illustrates a schematic of one embodiment of a portion of the half-adder circuit illustrates in FIG. 20A.

While FIG. 1 illustrates one embodiment of an implementation for an AND gate 10 realized in the MLA 234 portion of the nanoblock 216, FIG. 20A illustrates one implementation for a half-adder 250 circuit realized in the MLA 234 portion of the nanoblock 216. FIG. 20B illustrates one embodiment of a schematic 252 of the portion of the half-adder 250 circuit used to generate a sum output. The half adder 250 circuit computes the XOR function of A and B in a conventional implementation of diode-resistor logic. For example, if the A input is high and the B input is low, then the complements A-bar and B-bar are low and high, respectively. Thus, referring to the schematic 252, diodes 1, 2, 5, and 6 will be reverse biased and not conducting, while diode 8 will be forward biased, and will pull the line labeled "red" down close to a logic low state. This makes diode 4 forward biased. By manufacturing the resistors 253, 255 such that the resistors 253 attached to $V_{dd}$ have smaller impedances than the resistors 255 attached to Gnd, most of the voltage drop occurs across R1, resulting in S being high. If A and B are both low, then diodes 2, 4, 5 and 7 are back-biased and, thus, isolates S from $V_{dd}$ making it low. The MLA 234 computes logic functions and routes signals using diode-resistor logic. This scheme provides a benefit in that the half-adder 250 circuit can be constructed by directed assembly. Although there may occur some signal degradation every time the signal passes through a configurable switch, the molecular latch 30 can be used in order to restore the propagating signals to their proper logic values without resorting to using CMOS gates, which also may be used.

All the connections between a CMOS layer and a nano-block 216 may occur either between groups of wires or with a wire that is removed from all the other components. This improves the device density of the nano-fabric 200. To achieve a specific functionality the cross-points are configured to be either open-connections 251 or to be diodes 14.

The respective layout of the MLA 234 and of the switch block 224 may simplify rerouting in the presence of faults in the nano-fabric 200. For example, with reference to FIG. 20A, one skilled in the art will appreciate that a bad switch is easily avoided by swapping wires that only carry internal values. Further, the rows can be moved anywhere within the block without affecting the half-adder 250 circuit, which may make defect tolerance easier than with CMOS devices because nanowires have several orders of magnitude less resistance than switches. Thus, the timing of a switch-block 224 is unaffected by small permutations in the design. The number of possible ways to arrange the columns/rows in the MLA 234 combined with the configurable crossbar implemented by the switch block 224 makes the entire design robust to defects in either the switch block 224 or the MLA 234 portions of the nanoblock 216.

Defect Tolerance

The nano-fabric 200 is defect tolerant because it is regular, highly configurable, fine-grained, and has a rich interconnect. Defect tolerance through configuration also depends on short-circuit faults being significantly less likely to occur than stuck-open faults. This is arranged by biasing the synthesis techniques to increase the likelihood of a stuck-open fault at the expense of potentially introducing more total faults. The regularity of the nano-fabric 200 allows a choice where a particular function is implemented. The configurability of the nano-fabric 200 also allows a choice as to which nanowires, nanoblocks 216, or potions of a nanoblock 216 can be used to implement a particular circuit. The fine-grained nature of the device combined with the local nature of the interconnect reduces the impact of a defect to only a small portion of the nano-fabric 200 (or even a small portion of a single nanoblock 216). Finally, the rich interconnect provides a choice among many paths in implementing a circuit. Thus, with a defect map, working circuits can be created on a defective nano-fabric 200. Defect discovery relies on the fact that the nano-fabric 200 can be configured to implement any circuit, which implies that the nano-fabric 200 can be configured to test its own resources.

In one embodiment of the present invention, in testing the nano-fabric 200 (or any conventional FPGA) it is not possible to test the individual components in isolation. The researchers on the Teramac custom computer project faced similar issues and, accordingly, they devised an algorithm that allowed the Teramac custom computer, in conjunction with an outside host, to test itself. Despite the fact that over 75% of the chips in the Teramac custom computer have defects, the Teramac custom computer is still being used today. The basis of the defect mapping algorithm is to configure a set of devices to act as tester circuits. These tester circuits, e.g., linear-feedback shift-registers, will report a result which if correct indicates with high probability that devices they are made from are fault free.

One aspect of the defect mapping process is complicated by the fact there are no known fault-free regions in the nano-fabric 200 at the start of testing and as the defect density increases the chances of finding a good circuit decreases. Accordingly, in order to address such complications, one embodiment of the present invention provides a basic tester circuit implemented using CMOS components, which will provide the initial fault-free region. In a first phase of the testing process, a host computer configures tester circuits out of the CMOS testers and portions of the nano-fabric 200. As the host gains knowledge of the fault-free regions of the nano-fabric 200, it replaces more and more of the CMOS tester with configured sections of the nano-fabric 200.

After the host has discovered a sufficient number of functioning resources, a second phase of the testing process begins. For this phase, the host downloads a configuration, which performs the testing from within the nano-fabric 200. In other words, the already tested area of the nano-fabric 200 acts as a host for testing the remainder of the nano-fabric 200. Because the number of tests required to isolate any specific defect does not grow as the total size of the device grows, the computational work needed to test a device is at worst linear with respect to the size of the device. For very large devices, such defect discovery can be accomplished using many parallel independent test machines, for example.

Once a defect map has been generated the nano-fabric 200 can be used to implement arbitrary circuits. The architecture of the nanoblock 216 supports full utilization of the device even in the presence of a significant number of defects. Due to the way that logic is mapped to the wires and the switches, in one embodiment of the present invention only about 20% of the switches will be in use at any one time. Because the internal lines in a nanoblock 216 are completely interchangeable, in one embodiment of the present invention the switches that must be configured in the ON state can be rearranged to be on wires that avoid the defects.

While the molecules are expected to be robust over time, inevitably new defects will occur over time. Finding these new defects, however, may be significantly easier than doing the original defect mapping because the unknown defect density at such time will be very low.

Configuration

The nano-fabric 200 uses runtime reconfiguration for defect testing and to perform its intended function. Thus, in one embodiment of the present invention the time to configure the fabric should be scaled with the size of the device. There are generally two factors that contribute to the configuration time. The first factor is the time that it takes to download a configuration to the nano-fabric 200. The second factor is the time that it takes to distribute the configuration bits to the different regions of the nano-fabric 200. Configuration decoders may be required to serialize the configuration process in each nanoblock 216. To reduce the CMOS over-head, in one embodiment of the present invention, initially only one nanoblock 216 per cluster 226 at a time will be configured. The nano-fabric 200 can be designed, however, so that the clusters 226 can be programmed in parallel. In one example, one nanoblock 216 in each of 1000 clusters can be configured in parallel simultaneously.

A molecular switch is configured when the voltage across the device is increased outside the normal operating range. Devices in the switch blocks 224 can be configured directly by applying a voltage difference between the long inter-cluster lines. In order to achieve the densities presented above, one embodiment of the present invention provides a configuration approach for the switches in the MLA 234 that is implemented with nanoscale components. In particular, a nanoscale decoder can be provided to address each inter-section of the MLA 234 independently. Instead of addressing each nanoscale wire separately in space, they can be addressed separately in the time dimension. Although this may slow down the configuration time, it increases the device density.

In one embodiment of the present invention, a full nano-fabric 200 comprised of $10^9$ configuration bits at a density of $10^{10}$ configuration bits/cm$^2$ can be loaded in less than one second. This determination is based on general assumptions that, on average, fewer than 10% of the bits are set ON and that the configurations are highly compressible. Further, in one embodiment of the present invention, it is not necessary to configure the full nano-fabric 200 for defect testing. Rather, the configuration can be applied only to the portions under test.

As the configuration is loaded onto the nano-fabric 200 it will be used to configure the nanoblocks 216. Using a configuration decoder will require approximately 300 cycles per nanoblock 216, or less than about 38K cycles per cluster 226. Thus, the worst-case time to configure all the clusters 226 at a 10 MHz clock speed requires about three seconds, for example.

System Description

The nano-fabric 200 is a reconfigurable architecture built out of CMOS and CAEN technology. In one embodiment of the present invention, the support system, i.e., power, ground, clock, and configuration wires, I/O, and basic control, is implemented in CMOS. On top of the CMOS layer the nanoblocks 216 and long-lines 228 are constructed out of chemically self-assembled nanoscale components.

In one example, assuming a 100 nm CMOS process and 40 nm centers with 128 nanoblocks 216 to a cluster 226 and 30 long-lines 228 per channel, a design would yield about 750K clusters/cm$^2$ or about 1M blocks/cm$^2$, requiring about $3^{10}$ configuration bits. If the nanoscale wires are on about 10 nm centers this design yields about 1 M clusters/cm$^2$. If, instead of molecular latches, transistors were used for signal restoration, then with 40 nm centers for the nanoscale wires about 180K cluster/cm$^2$ can be obtained. SPICE simulations show that a nanoblock 216 configured to act as a half-adder 250 can operate at between 100 MHz and 1 GHz. Preliminary calculations show that the nano-fabric 200 as a whole will have a static power dissipation of approximately 1.2 watts and dynamic power consumption of approximately 0.4 watts at 100 MHz.

While the present invention has been described in conjunction with its presently contemplated best mode, it is clear that it is susceptible to various modifications, modes of operation, and embodiments, all within the ability of those skilled in the art and without exercise of further inventive activity. Further, while the present invention has been described in connection with what is presently considered the most practical and preferred embodiments, it is to be understood that the invention is not limited to the disclosed embodiments, but on the contrary, it is intended to cover various modifications and equivalent arrangements included within the scope of the appended claims. The foregoing description and the following claims are intended to cover all such modifications and variations.

What is claimed is:

1. A latch, comprising:
    a first resonant tunneling diode having a first end and a second end, the first end forming an input node;
    a second resonant tunneling diode having a first end and a second end, wherein the second end of the first resonant tunneling diode is connected to the first end of the second resonant tunneling diode forming a data node at a connection point therebetween;
    wherein an input voltage can be applied to the data node for latching a logic state at the data node; and
    an isolation circuit connected to the data node, wherein the isolation circuit prevents a low-resistance path to around from forming between the first resonant tunneling diode and a downstream circuit component.

2. The latch of claim 1, wherein the input node of the first resonant tunneling diode is driven by a clocking scheme for the latching the data node.

3. The latch of claim 1, wherein the clocking scheme comprises a two-phase clock comprised of alternating clock phases.

4. The latch of claim 1, wherein the isolation circuit further comprises a rectifier connected to the data node of the latch.

5. The latch of claim 1, wherein the isolation circuit further comprises a first resistor having a first and second end, wherein the first end is connected to the data node, and the second end is connected to an output.

6. The latch of claim 1, wherein a voltage at the data node evolves to a first logic state when current in excess of a threshold is introduced in the data node and the current flows through the second resonant tunneling diode during an evolution from a monostable state to a bistable state of the latch.

7. The latch of claim 1, wherein a voltage at the data node evolves to a second logic state when no current is introduced in the data node and no current flows through the second resonant tunneling diode during an evolution from a monostable state to a bistable state of the latch.

8. The latch of claim 1, wherein the second resonant tunneling diode is more resistive than the first resonant tunneling diode.

9. The latch of claim 8, wherein the rectifier is connected to an input portion of the data node.

10. The latch of claim 1, wherein the latch is formed from molecular components.

11. The latch of claim 1, wherein the latch is formed from solid-state components.

12. The latch of claim 1, wherein the isolation circuit prevents current from the downstream circuit component from flowing to an upstream circuit component; and wherein the isolation circuit provides a discharge path to ground for discharging the downstream circuit component.

13. A circuit, comprising:
    a first combinational circuit;
    a first latch connected to the first combinational circuit, wherein the first latch is driven by a first clock signal and the first combinational circuit is powered by a first voltage;
    a second combinational circuit connected to the first latch; and
    a second latch connected to the second combinational circuit, wherein the second latch is driven by a second clock signal and the second combinational circuit is powered by a second voltage; and
    a power supply clocking scheme to provide Input/Output isolation, wherein the first clock and the first voltage are applied to the first latch and the first combinational circuit and the second clock and the second voltage are applied to the second latch and the second combinational circuit to provide Input/Output isolation between the first latch and the first and second combinational circuits and the second latch; and
    wherein each of the first and second latches further comprise:
        a first resonant tunneling diode having a first end and a second end, the first end forming an input node;

a second resonant tunneling diode having a first end and a second end, wherein the second end of the first resonant tunneling diode is connected to the first end of the second resonant tunneling diode forming a data node at a connection point therebetween; and
an isolation circuit connected to the data node.

14. The circuit of claim 13, wherein the isolation circuit further comprises a rectifier connected to the input of the latch.

15. The circuit of claim 13, wherein the isolation circuit further comprises a first resistor having a first and second end, wherein the first end is connected to the data node of and an output of the latch.

16. The circuit of claim 13, wherein the isolation circuit further comprises a second resistor connected between the second end of the first resistor and the second end of the second resonant tunneling diode.

17. The circuit of claim 13, wherein the isolation circuit prevents current from a downstream latch from flowing to a second upstream latch.

18. The circuit of claim 13, wherein the isolation circuit prevents a low-resistance path to ground from forming between the first resonant tunneling diode and a second downstream latch.

19. The circuit of claim 13, wherein the isolation circuit provides a discharge path to ground for discharging a second downstream latch.

20. A circuit, comprising:
a combinational logic circuit having an input and an output and power supply input; and
a latch having an input and an output and a clock input, the latch input is connected to the output of the combinational logic circuit;
wherein the latch is driven by a power supply clocking scheme for providing Input/Output isolation; and
wherein when a clock signal is applied to the latch the combinational logic circuit power supply input is modified to enable the operation of the latch and provide the Input/Output isolation between the combinational logic circuit and the latch; and
wherein the latch further comprises:
a first resonant tunneling diode having a first end and a second end, the first end forming an input node;
a second resonant tunneling diode having a first end and a second end, wherein the second end of the first resonant tunneling diode is connected to the first end of the second resonant tunneling diode forming a data node at a connection point therebetween; and
an isolation circuit connected to the data node of the latch.

21. The circuit of claim 20, wherein the logic circuit is arranged to implement a DELAY function.

22. The circuit of claim 20, wherein the logic circuit is arranged to implement a logic AND function.

23. The circuit of claim 20, wherein the logic circuit is arranged to implement a logic OR function.

24. The circuit of claim 20, wherein the logic circuit is arranged to implement a logic XOR function.

25. The circuit of claim 20 wherein the logic circuit is arranged to implement a HALF ADDER logic function.

26. The circuit of claim 20, wherein the clocking scheme comprises a two-phase clock comprised of alternating clock phases for driving the first resonant tunneling diode.

27. The circuit of claim 20, wherein the isolation circuit further comprises a rectifier connected to the input of the latch.

28. The circuit of claim 20, wherein the isolation circuit further comprises a first resistor having a first and second end, wherein the first end is connected to the data node of the molecular latch.

29. The circuit of claim 28, wherein the isolation circuit further comprises a second resistor connected between the second end of the first resistor and ground.

30. The circuit of claim 20, wherein the first and second resonant tunneling diodes and the isolation circuit are formed with molecular elements.

31. The circuit of claim 20, wherein the first and second resonant tunneling diodes and the isolation circuit are formed with solid-state elements.

32. The circuit of claim 20, wherein the isolation circuit prevents current from a downstream latch from flowing to a second upstream latch.

33. The circuit of claim 20, wherein the isolation circuit prevents a low-resistance path to ground from forming between the first resonant tunneling diode and a second downstream latch.

34. The circuit of claim 20, wherein the isolation circuit provides a discharge path to ground for discharging a second downstream latch.

35. The circuit of claim 20, wherein the combinational logic circuit is implemented in a nanoblock.

36. A latch, comprising:
a first resonant tunneling diode having a first end and a second end, the first end forming an input node;
a second resonant tunneling diode having a first end and a second end, wherein the second end of the first resonant tunneling diode is connected to the first end of the second resonant tunneling diode forming a data node at a connection point therebetween;
wherein an input voltage can be applied to the data node for latching a logic state at the data node; and
an isolation circuit connected to the data node, wherein the isolation circuit prevents current from a downstream latch from flowing to a second upstream latch; and wherein the isolation circuit prevents a low-resistance path to ground from forming between the first resonant tunneling diode and a second downstream latch; and wherein the isolation circuit provides a discharge path to ground for discharging the downstream latch.

37. The latch of claim 36, wherein the input node of the first resonant tunneling diode is driven by a clocking scheme for the latching the data node.

38. The latch of claim 36, wherein the clocking scheme comprises a two-phase clock comprised of alternating clock phases.

39. The latch of claim 36, wherein the isolation circuit further comprises a rectifier connected to the data node of the latch.

40. The latch of claim 36, wherein the isolation circuit further comprises a first resistor having a first and second end, wherein the first end is connected to the data node, and the second end is connected to an output.

41. The latch of claim 40, wherein the isolation circuit further comprises a second resistor connected between the second end of the first resistor and the second end of the second resonant tunneling diode.

42. The latch of claim 36, wherein a voltage at the data node evolves to a first logic state when current in excess of a threshold is introduced in the data node and the current flows through the second resonant tunneling diode during an evolution from a monostable state to a bistable state of the latch.

43. The latch of claim 36, wherein a voltage at the data node evolves to a second logic state when no current is introduced in the data node and no current flows through the second resonant tunneling diode during an evolution from a monostable state to a bistable state of the latch.

44. The latch of claim 36, wherein the second resonant tunneling diode is more resistive than the first resonant tunneling diode.

45. The latch of claim 44, wherein the rectifier is connected to an input portion of the data node.

46. The latch of claim 36, wherein the latch is formed from molecular components.

47. The latch of claim 36, wherein the latch is formed from solid-state components.

48. A latch, comprising:
   a first resonant tunneling diode having a first end and a second end, the first end forming an input node;
   a second resonant tunneling diode having a first end and a second end, wherein the second end of the first resonant tunneling diode is connected to the first end of the second resonant tunneling diode forming a data node at a connection point therebetween;
   wherein an input voltage can be applied to the data node for latching a logic state at the data node; and
   an isolation circuit connected to the data node, wherein the isolation circuit further comprises a first resistor having a first and second end, wherein the first end is connected to the data node, and the second end is connected to an output, and wherein the isolation circuit further comprises a second resistor connected between the second end of the first resistor and the second end of the second resonant tunneling diode.

49. The latch of claim 48, wherein the input node of the first resonant tunneling diode is driven by a clocking scheme for the latching the data node.

50. The latch of claim 48, wherein the clocking scheme comprises a two-phase clock comprised of alternating clock phases.

51. The latch of claim 48, wherein the isolation circuit further comprises a rectifier connected to the data node of the latch.

52. The latch of claim 48, wherein the isolation circuit prevents current from a downstream latch from flowing to a second upstream latch; and wherein the isolation circuit prevents a low-resistance path to ground from forming between the first resonant tunneling diode and a second downstream latch; and wherein the isolation circuit provides a discharge path to ground for discharging the downstream latch.

53. The latch of claim 48, wherein a voltage at the data node evolves to a first logic state when current in excess of a threshold is introduced in the data node and the current flows through the second resonant tunneling diode during an evolution from a monostable state to a bistable state of the latch.

54. The latch of claim 48, wherein a voltage at the data node evolves to a second logic state when no current is introduced in the data node and no current flows through the second resonant tunneling diode during an evolution from a monostable state to a bistable state of the latch.

55. The latch of claim 48, wherein the second resonant tunneling diode is more resistive than the first resonant tunneling diode.

56. The latch of claim 55, wherein the rectifier is connected to an input portion of the data node.

57. The latch of claim 48, wherein the latch is formed from molecular components.

58. The latch of claim 48, wherein the latch is formed from solid-state components.

* * * * *

UNITED STATES PATENT AND TRADEMARK OFFICE
CERTIFICATE OF CORRECTION

PATENT NO. : 6,777,982 B2
DATED : August 17, 2004
INVENTOR(S) : Seth Copen Goldstein and Daniel L. Rosewater It is certified that error appears in the above-identified patent and that said Letters Patent is hereby corrected as shown below:

Title page,
Item [56], References Cited, OTHER PUBLICATIONS, delete "S.C. Goldstein et al., Nanofabrics: Spatial CoOmputing" and replace therewith -- S.C. Goldstein et al., Nanofabrics: Spatial Computing --.
Delete "R. Chen, Single-Electron Transistor Logic, *Appl.,*" and replace therewith -- R. Chen, Single-Electron Transistor Logic, *Appl., Phys.* --.

Column 24,
Line 3, delete "around" and replace therewith -- ground --.

Signed and Sealed this

Seventeenth Day of May, 2005

JON W. DUDAS
*Director of the United States Patent and Trademark Office*